United States Patent
Kuriyama et al.

(10) Patent No.: US 9,642,257 B2
(45) Date of Patent: May 2, 2017

(54) DISPLAY DEVICE

(71) Applicant: Sharp Kabushiki Kaisha, Osaka-shi, Osaka (JP)

(72) Inventors: Toru Kuriyama, Osaka (JP); Hideki Morii, Osaka (JP); Hirofumi Miyamoto, Osaka (JP); Takayuki Mizunaga, Osaka (JP); Yuta Ueyama, Osaka (JP); Toshihiro Yanagi, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 198 days.

(21) Appl. No.: 14/440,638

(22) PCT Filed: Nov. 5, 2013

(86) PCT No.: PCT/JP2013/079829
§ 371 (c)(1),
(2) Date: Jul. 17, 2015

(87) PCT Pub. No.: WO2014/073504
PCT Pub. Date: May 15, 2014

(65) Prior Publication Data
US 2015/0319862 A1   Nov. 5, 2015

(30) Foreign Application Priority Data

Nov. 12, 2012   (JP) .................................. 2012-248548

(51) Int. Cl.
*G02F 1/1345* (2006.01)
*H05K 1/14* (2006.01)
(Continued)

(52) U.S. Cl.
CPC ......... *H05K 1/148* (2013.01); *G02F 1/13452* (2013.01); *H05K 1/028* (2013.01);
(Continued)

(58) Field of Classification Search
CPC combination set(s) only.
See application file for complete search history.

(56) References Cited

U.S. PATENT DOCUMENTS

| 5,654,730 A | 8/1997 | Tanaka |
| 2008/0137275 A1 | 6/2008 | Tada |

(Continued)

FOREIGN PATENT DOCUMENTS

| JP | 11-024097 A | 1/1999 |
| JP | 11-038430 A | 2/1999 |

(Continued)

OTHER PUBLICATIONS

Official Communication issued in International Patent Application No. PCT/JP2013/079829, mailed on Feb. 10, 2014.

*Primary Examiner* — Wen-Ying P Chen
(74) *Attorney, Agent, or Firm* — Keating & Bennett, LLP

(57) ABSTRACT

The liquid crystal display device includes a liquid crystal panel including a display area for displaying images and a non-display area other than the display area, a rigid board configured to connect with an external signal source, and a flexible board. The liquid crystal panel and the flexible board are arranged in a first direction. A direction perpendicular to the first direction and along a plate surface of the liquid crystal panel is a second direction. The flexible board is larger in a dimension in the second direction than the rigid board, and includes an end portion including at least an outer portion located outside of the rigid board in the second direction, and a middle portion located about a middle of the flexible board with respect to the end portion in the second direction. The end portion is larger in dimension in the first direction than the middle portion.

20 Claims, 22 Drawing Sheets

(51) Int. Cl.
 *H05K 1/02* (2006.01)
 *H05K 1/11* (2006.01)
 *H05K 3/36* (2006.01)

(52) U.S. Cl.
 CPC ........ *G02F 1/13454* (2013.01); *H05K 1/0296* (2013.01); *H05K 1/118* (2013.01); *H05K 3/361* (2013.01); *H05K 2201/09227* (2013.01); *H05K 2201/10136* (2013.01)

(56) References Cited

U.S. PATENT DOCUMENTS

2009/0153790 A1* 6/2009 Tashiro .............. G02F 1/13452
 349/149
2011/0235286 A1* 9/2011 Kitayama .......... G02F 1/13452
 361/749

FOREIGN PATENT DOCUMENTS

JP 2008-145840 A 6/2008
WO 2011/070709 A1 6/2011

* cited by examiner

DISPLAY DEVICE

TECHNICAL FIELD

The present invention relates to a display device.

BACKGROUND ART

Electronic devices such as laptop computers include display devices that include display panels such as liquid crystal panels. Such a display device may include a display panel, a signal supply board, and a flexible board. The display panel includes a display area in which images are displayed. The signal supply board is connected to a signal source. The flexible board is connected to both of the display panel and the signal supply board so that signals from the signal source are transmitted to the display panel therethrough. Patent document 1 discloses an example of this kind of display devices.

RELATED ART DOCUMENT

Patent Document

Patent Document 1: Japanese Unexamined Patent Application Publication No. H11-38430

Problem to be Solved by the Invention

The flexible board disclosed in Patent document 1 has a slit and a portion of the flexible board is folded backward by the formation of the slit. According to this configuration, the display device can have a space for a mounting hole at a corner of a metal frame thereof.

The portion of the flexible board that is folded, which is a folded portion, is not connected with the signal feeding board. Therefore, it is necessary to route tracing lines to a portion of the flexible board that is unfolded, which is an unfolded portion. However, since the slit is in between the folded portion and the unfolded portion, an enough area for routing the tracing lines to the unfolded portion may not be provided. If the liquid crystal panel has higher definition (higher resolution) and more tracing lines are necessary to be routed on the liquid crystal panel and the flexible board, it is necessary to increase an area of a connection portion of the flexible board connecting the folded portion and the unfolded portion. This may result in an increase in width of a frame of the display device. Namely, it is difficult to obtain a display device with higher definition with a smaller frame in size.

DISCLOSURE OF THE PRESENT INVENTION

The present invention described herein was made in view of the above circumstances. An object of the present invention described herein is to provide a display device with higher definition with a smaller frame in size.

Means for Solving the Problem

A display device according to the present invention includes a display panel, a signal supplying board, and a flexible board. The display panel includes a display area for displaying an image and a non-display area other than the display area. The signal supplying board is configured to be connected to an external signal source. The flexible board has flexibility and includes one edge portion connected to the non-display area of the display panel and another edge portion connected to the signal supplying board to relay a signal through the signal supplying board. The display panel and the flexible board are arranged in a first direction. A direction perpendicular to the first direction and along a plate surface of the display panel is a second direction. The flexible board has a dimension in the second direction larger than a dimension of the signal supplying board. The flexible board includes an end portion and a middle portion. The end portion includes at least an outer portion of the flexible board located on an outer side with respect to the signal supplying board in the second direction. The middle portion is located about a middle of the flexible board with respect to the end portion in the second direction. The end portion has a dimension in the first direction larger than a dimension of the middle portion in the first direction.

In this configuration, one of the edge portions of the flexible board is connected to the non-display area of the display panel and the other one of the ends of the flexible board is connected to the signal supplying board. Therefore, the signal transmitted from the external signal source to the signal supplying board is transmitted to the display panel via the flexible board. The flexible board and the display panel are arranged in the first direction, and the second direction is perpendicular to the first direction and along the plate surface of the display panel. The dimension of the flexible board in the second direction is larger than the dimension of the signal supplying board in the second direction. According to this configuration, a portion of the flexible board connected to the display panel increases in size compared to a flexible board and a signal supplying board having the same dimension in the second direction. This configuration is preferable to a display panel having a larger number of tracing lines thereon in accordance with an improvement in definition (resolution) of the display panel. The dimension of the signal supplying board in the second direction is smaller than the dimension of the flexible board in the second direction. Therefore, the signal supplying board is less likely to contact with other components arranged on the outer side with respect to the signal supplying board in the second direction.

The end portion that includes at least the outer portion of the flexible board located on the outer side with respect to the signal supplying board in the second direction has the dimension in the first direction larger than that of the middle portion located about the middle of the flexible board with respect to the end portion in the second direction. The end portion is used for an area where traces are patterned and therefore, a frame size of the display device decreases. Reasons of this reduction will be described in detail. The flexible board is larger in dimension in the second direction than the signal supplying board. Therefore, in designing a tracing pattern of the tracing lines on the flexible board, it is necessary to route the tracing lines so as to gather together from the end toward the middle in the second direction. As described above, the end portion of the flexible board is larger in dimension in the first direction than the middle portion. Thus, the end portion has an adequate space in which the tracing lines are routed to gather toward the middle. If the end portion and the middle portion have the same dimension in the first direction, it is necessary to use a space for tracing patterns in the display panel. Compared to such a configuration, the configuration according to the present technology reduces the width of the non-display area of the display panel and accordingly reduces the frame size of the display device. Thus, the display device having higher definition with a smaller frame in size is obtained.

The following configurations of the display device according to the present invention are preferable.

(1) The end portion of the flexible board may further include an adjacent portion adjacent to the outer portion that is located on the outer side with respect to the signal supplying board in the second direction. By using the end portion of the flexible board as the area for routing the tracing pattern, the area with a larger dimension in the second direction is provided. Thus, this configuration is preferable to obtain the display device having higher definition with a smaller frame in size.

(2) The flexible board may be connected to the signal supplying board at the adjacent portion that is adjacent to the outer portion of the end portion located on the outer side with respect to of the signal supplying board in the second direction. The outer portion located on the outer side with respect to the signal supplying board in the second direction may have a dimension in the first direction that is constant or increases from an end of the flexible board toward the middle of the flexible board in the second direction. Flexible boards tend to have tracing patters with higher density as their display panels obtain higher definition. As described above, the outer portion located on the outer side with respect to the signal supplying board in the second direction has the dimension in the first direction that is constant or increases from the end of the flexible board toward the middle of the flexible board in the second direction. If a slit is formed in the outer portion of the flexible board located on the outer side with respect to the signal supplying board in the second direction, the dimension of the outer portion in the first direction is locally narrow in its area ranging from the end toward of the flexible board toward the middle thereof in the second direction. Compared to such a configuration, the configuration of the present invention is preferable for forming the tracing pattern with high density, and thus preferable for the display panel having higher definition.

(3) The signal supplying board may include an end portion and a middle portion. The end portion is connected to the end portion of the flexible board. The middle portion is connected to the middle portion of the flexible board. The end portion of the signal supplying board has a dimension in the first direction smaller a dimension of the middle portion of the signal supplying board in the first direction. As an example, a signal supplying board may have an end portion and a middle portion that are equal in dimension in the first direction, and an end portion of a flexible board and a middle portion of the flexible board may be connected at different position of the display panel in the first direction. Compared to such a configuration, a position of the display panel to which the end portion is connected and a portion of the display panel to which the middle portion is connected are close to each other in the first direction. As another example, a signal supplying board may have an end portion and a middle portion that are equal in dimension in the first direction, and the signal supplying board may have a step-like edge at a side thereof away from the flexible board. Compared to such a configuration, the signal supplying board of this invention is less likely to have such a step-like edge.

(4) The end portion of the signal supply board and the middle portion of the signal supply board each include an edge away from the flexible board. The edges of the end portion and the middle portion of the signal supply board are flush with each other. According to this configuration, the signal supplying board is less likely to have a step-like shape at the edge thereof away from the flexible board. Thus, the signal supplying board is less likely to contact with other components.

(5) The end portion of the flexible board and the middle portion of the flexible board are connected at a same position of the display panel with respect to the first direction. According to this configuration, the flexible board can be connected to the display panel using an automated device and thus the flexible board is efficiently and easily connected.

(6) The end portion and the middle portion of the flexible board are at least separate from each other. The flexible board includes a divided flexible end board corresponding to the end portion, and a divided flexible middle board corresponding to the middle portion. Each of the divided flexible end boards and the divided flexible middle board extends or contracts, individually, when thermal environment changes. The amount of extension or contraction of each divided flexible board is based on the size of each divided flexible board. The amount of thermal extension or contraction of each divided flexible board is relatively smaller than the amount of thermal expansion or contraction in a flexible board that is not divided. When the flexible board is connected to the display panel with thermal compression bonding, the divided flexible boards expand or contract due to the thermal compression but the amount of expansion or contraction is relatively small. Thus, each divided flexible board is connected to a proper position of the display panel. Further, the end portion and the middle portion of the flexible board are at least separate from each other, and the dimension of the end portion in the first direction is different from the dimension of the middle portion in the first direction. That is, the divided flexible end board and the divided flexible middle board have different dimensions in the first direction but a dimension of each individual board in the first direction is constant. Accordingly, the production cost of the divided flexible portions reduces.

(7) The divided flexible middle board may include multiple separate pieces as divided flexible middle pieces. According to this configuration, the amount of thermal expansion or contraction of each of the divided flexible middle pieces included in the divided flexible middle board is smaller than that of a divided flexible middle board without a divided configuration. Thus, the amount of extension or contraction of the divided flexible middle piece further decreases during thermal compressing of the flexible board to the display panel. Thus, each divided flexible middle piece is connected to a proper position of the display panel.

(8) The signal supplying board includes an end portion and a middle portion. The end portion of the signal supplying board is connected to the end portion of the flexible board. The middle portion of the signal supplying board is connected to the middle portion of the flexible board. The end portion of the signal supplying board is smaller in dimension in the first direction than the middle portion of the signal supplying board. The divided flexible end board of the flexible board is connected to the end portion of the signal supplying board, and the divided flexible middle board is connected to the middle portion of the signal supplying board. According to this configuration, the divided flexible end board, which has a relatively larger dimension in the first direction, is connected to the end portion of the signal supplying board, which has a relatively smaller dimension in the first direction. Further, the divided flexible middle board, which has a relatively smaller dimension in the first direction, is connected to the middle portion of the signal supplying board, which has a relatively larger dimension in the first direction. According to this configuration, each of the divided flexible boards is less likely to be connected with both of the end portion and middle portion of the signal supplying board.

(9) The display device may further include driving circuits mounted on a portion of the non-display area of the display panel between the display area and the flexible board. The driving circuits are configured to process a signal transmitted from the signal supplying board and the flexible board, generate an output signal, and send the output signal to the display area for driving the display panel. The driving circuits may be arranged in the non-display area along the second direction and include at least an end driving circuit and a middle driving circuit. The end driving circuit portion is connected to the divided flexible end board. The middle driving circuit portion is connected to the divided flexible middle board. According to this configuration, the driving circuits connected to the non-display area of the display panel process signals transmitted from the signal supplying board and the flexible board, generate output signals, and send the output signals to the display area and thus the display panel is driven. Signals transmitted via the divided flexible end board are processed by the end driving circuit portion of the driving circuits. Signals transmitted via the divided flexible middle board are processed by the middle driving circuit portion of the driving circuits. As is described above, the driving circuits include the end driving circuit portion to which the divided flexible end board is connected and the middle driving circuit portion to which the divided flexible middle board is connected. According to this configuration, the tracing pattern to connect the divided flexible boards and the driving circuit portions are effectively arranged in the non-display area. This configuration is further preferable to the display panel having higher definition with a smaller frame size.

(10) The outer portion located on the outer side with respect to the signal supplying board in the second direction and constituting at least a portion of the end portion of the flexible board may include an oblique portion at the other edge portion of the flexible board. As described above, the outer portion of the flexible board located on the outer side with respect to the signal supplying board in the second direction includes the oblique portion at the other edge portion thereof, that is, an edge portion of the flexible board away from the display panel. With this configuration, the flexible board is less likely to contact with members arranged on the outer side with respect to the flexible board in the first direction.

(11) The signal supplying board and the flexible board may be an integrated member as a rigid-flex board. The rigid-flex board may include a flexible member having flexibility and a pair of rigid members having rigidity. The pair of the rigid members and a portion of the flexible member sandwiched by the pair of the rigid member constitute a rigid board portion. Another portion of the flexible member constitutes a flexible board portion. The flexible board portion may have a dimension in the second direction larger than a corresponding dimension of the rigid board portion. The flexible board portion may include an end portion and a middle portion. The end portion may include at least an outer portion that is located on the outer side with respect to the rigid board portion in the second direction. The middle portion of the flexible board portion may be located about a middle of the flexible board portion with respect to the end portion in the second direction. The end portion has a dimension in the first direction larger than a dimension of the middle portion in the first direction. In this configuration, the signal supplying board and the flexible board are an integrated member as the rigid-flex board. Compared to a configuration in which the signal supplying board and the flexible board are independent members and they are mechanically interconnected by thermal compression, connecting defects are less likely to occur and further interconnection resistance is reduced. According to this invention, the flexible board portion is larger in dimension in the second direction than the rigid board portion. Compared to a configuration in which the flexible board portion has a dimension in the second direction equal to that of the rigid board portion, the flexible board portion has a larger area to be connected to the display panel. This configuration is preferable to the display panel having higher definition. The rigid board portion is smaller in the second direction than the flexible board portion. Thus, the rigid board portion is less likely to contact with components arranged on the outer side with respect to the rigid board portion in the second direction. Furthermore, the end portion of the flexible board portion including at least the outer portion that is located on the outer side with respect to the rigid board portion in the second direction is larger in dimension in the first dimension than the middle portion of the flexible board portion located about the middle with respect to the end portion in the second direction. By using the end portion of the flexible board portion as an area for routing the tracing pattern, the frame size of the display device is reduced.

(12) The display panel may further include signal transmission lines in a portion of the non-display area between the display area and the flexible board. The signal transmission lines are configured to transmit a signal sent through the signal supplying board and the flexible board to the display area. In addition to this configuration, by routing tracing lines in the end portion of the flexible board such that the tracing lines gather from the end of the flexible board toward the middle of the flexible board, the signal transmission lines in the display panel are not necessarily routed such that the lines gather from the end of the display panel toward the middle of the display panel. Accordingly, it is not necessary to allocate a larger space for the signal transmission lines in the non-display area of the display panel. Thus, this configuration enables the display panel to have high definition while the display device has a smaller frame size.

(13) The display panel is a liquid crystal display panel including a pair of substrates and liquid crystals sealed between the substrates. Applications of such a display device include electronic devices including personal digital assistances (e.g., laptop computers), mobile phones, and portable video game players.

Advantageous Effect of the Invention

According to the present invention, a display device with higher definition with a smaller frame in size is obtained.

MODE FOR CARRYING OUT THE INVENTION

First Embodiment

Figure 2:
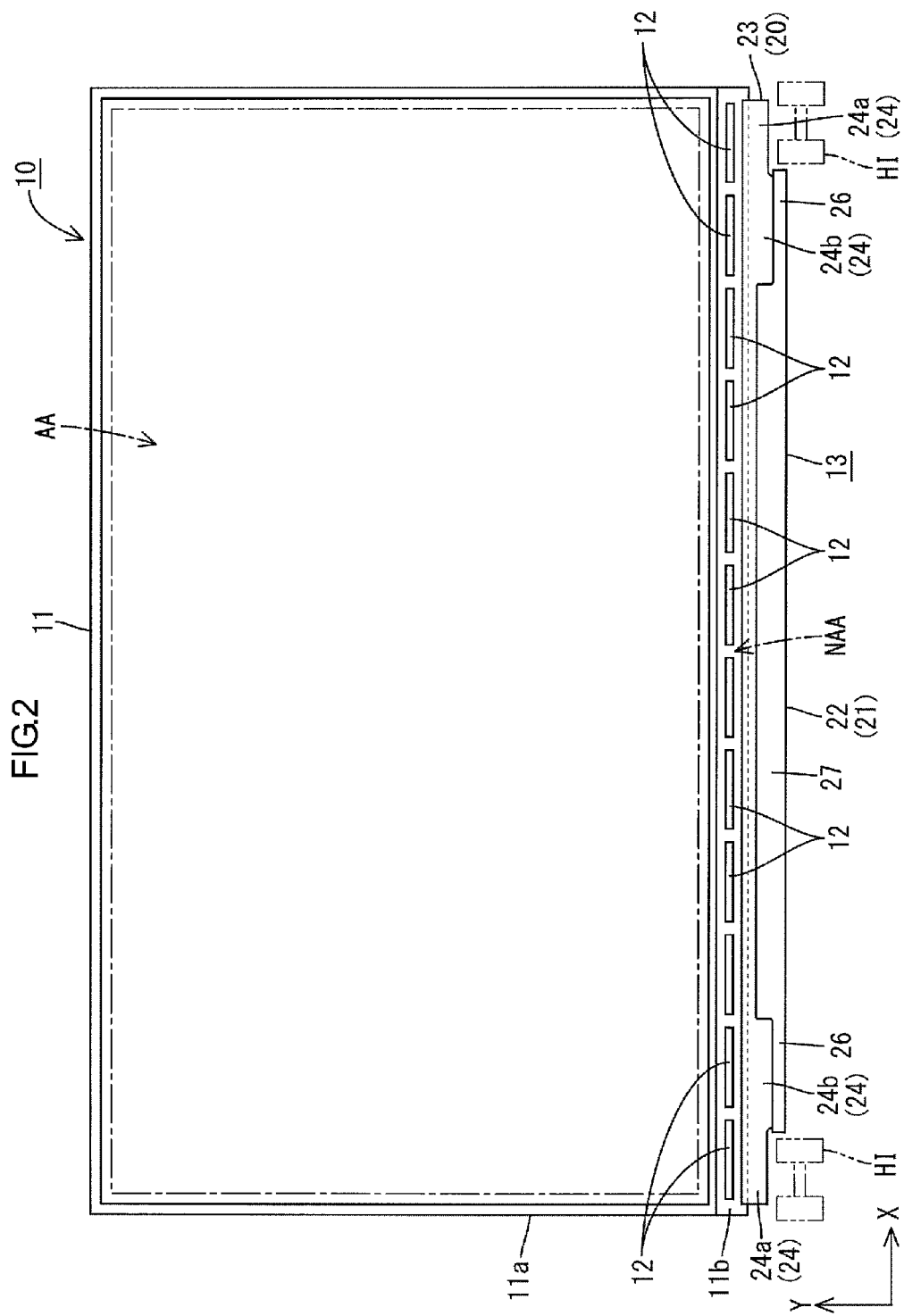
FIG. 2 is a plan view of a liquid crystal panel and a rigid-flex board.
Figure 3:
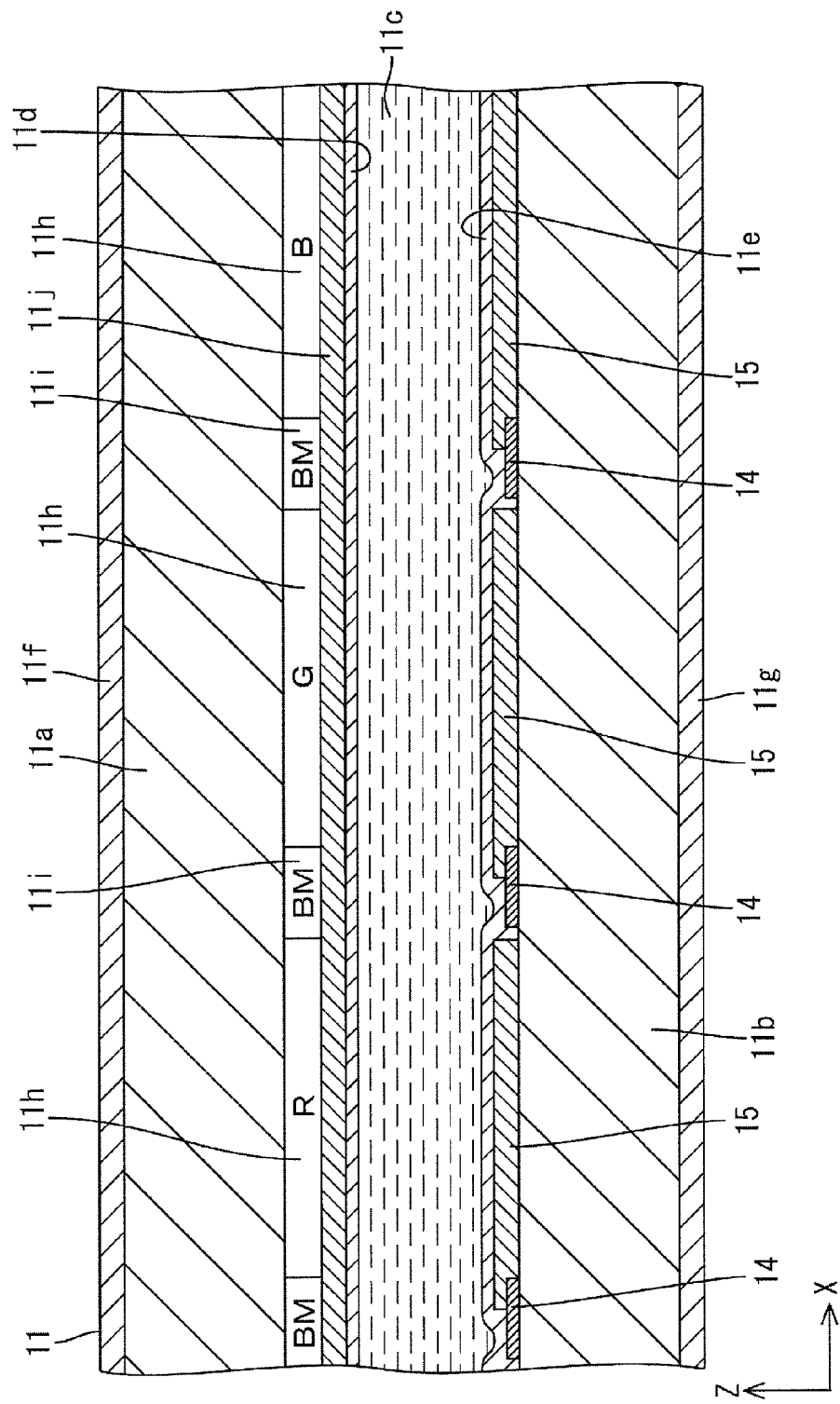
FIG. 3 is a cross-sectional view of the liquid crystal panel.

A first embodiment will be described with reference to FIGS. 1 through 8. A liquid crystal display device 10 (a display device) according to this embodiment is used in a laptop computer (a laptop personal computer) NP. X-axis, Y-axis and Z-axis are indicated in the drawings. The axes in each drawing correspond to the respective axes in other drawings. The vertical direction in FIG. 3 is defined as a reference. The upper side and the lower side in FIG. 3 correspond to the front side and the rear side, respectively.

Figure 1:
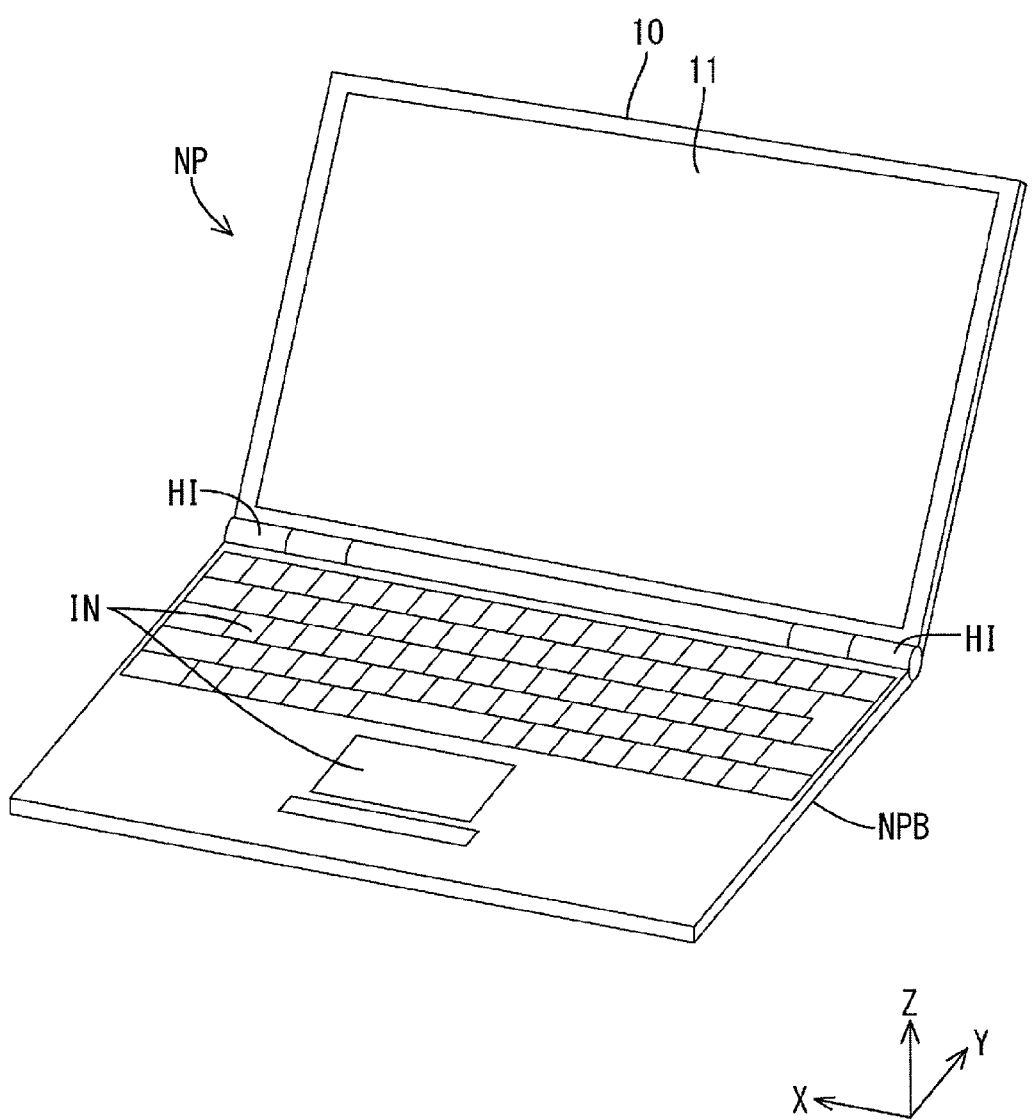
FIG. 1 is a perspective view of a laptop personal computer according to a first embodiment.

As illustrated in FIG. 1, the laptop computer NP includes at least a computer body NPB and the liquid crystal display device 10. The liquid crystal display device 10 is pivotally connected to the computer body NPB with hinges HI. The computer body NPB includes at least an input unit IN and a main board (not illustrated). The input unit IN may be a keyboard or a touch pad through which a user inputs information. The main board is electrically connected to the input unit IN and the liquid crystal display device 10 for exchanging various signals with them. The computer body NPB further includes an arithmetic unit such as a central processing unit (CPU), a volatile memory unit such as a semiconductor memory, and a non-volatile secondary memory unit such as a hard disk. Two hinges HI are disposed at ends of a connecting portion between the computer body NPB and the liquid crystal display device 10 and thus the liquid crystal display device 10 pivots around an axis of the hinges HI with respect to the computer body NPB. The liquid crystal display device 10 is opened and closed within a predetermined angle range with respect to the computer body NPB. As illustrated in FIG. 2, the liquid crystal display device 10 includes at least a liquid crystal panel (a display panel) 11 for displaying images, drivers 12 (a driving circuit) for driving the liquid crystal panel 11, a rigid-flex board (a flexible board and a signal supplying board) 13 connected to the liquid crystal display device 10, and a backlight device (not illustrated) for emitting light toward the liquid crystal panel 11. Each of the computer body NPB and the liquid crystal display device 10 includes a cabinet (i.e. an exterior member or a decorative member) made of a synthetic resin or metal.

Components of the liquid crystal display device 10 will be described in detail. First, the liquid crystal panel 11 will be described. As illustrated in FIG. 2, the liquid crystal panel 11 has a horizontally elongated (or rectangular) overall shape. The liquid crystal panel 11 has a display area (an active area) AA in which images are displayed. The display area AA is offset toward one of edges of a short dimension of the liquid crystal panel 11 (the upper edge in FIG. 1). The drivers 12 and the rigid-flex board 13 are connected to a portion of the liquid crystal panel 11 closer to the other edge of the short dimension of the liquid crystal panel 11 (the lower edge in FIG. 1). An area of the liquid crystal panel 11 outside the display area AA is a non-display area (a non-active area) NAA in which images are not displayed. The non-display area NAA includes a frame-like section around the display area AA (an area corresponding to a frame area of a CF board 11a, which will be described later) and a section closer to the other edge of the short dimension of the liquid crystal panel 11 (an exposed area of an array board 11b not overlapping the CF board 11a). The section closer to the other edge of the short dimension, which extends in the X-axis direction, includes a mounting section for the drivers 12 and the rigid-flex board 13 (a connecting section). A long-side direction of the liquid crystal panel 11 corresponds with the X-axis direction and a short-side direction of the liquid crystal panel 11 corresponds with the Y-axis direction in the drawings. In FIG. 2, a solid line indicates an outline of the display area AA that is slightly smaller than the CF board 11a. An area outside of the solid line is the non-display area NAA. The display size of the liquid crystal panel 11 of the liquid crystal display device 10 is from several inches to a dozen inches. Namely, the liquid crystal panel 11 is generally classified as a small sized or a medium sized panel.

As illustrated in FIG. 3, the liquid crystal panel 11 includes a pair of transparent glass substrates 11a, 11b (with light transmissivity) and a liquid crystal layer 11c in between the substrates 11a and 11b. The liquid crystal layer 11c contains liquid crystal molecules, which are substances that change optical characteristics when electromagnetic field is applied. The substrates 11a, 11b are bonded together with a sealant, which is not illustrated, while a gap equal to the thickness of the liquid crystal layer 11c is maintained. One of the substrates 11a, 11b on the front side is the CF board 11a and the other one on the rear side is the array board 11b. As illustrated in FIG. 2, a long dimension of the CF board is substantially the same as that of the array board 11b and a short dimension of the CF board 11a is substantially smaller than that of the array board 11b. The CF board 11a is bonded to the array board 11b with one of edges of the short dimension of the CF board 11a (the upper edge in FIG. 1) aligned with one of edges of the array board 11b.

Therefore, a portion of the array board 11b closer to the other one of the edges thereof (the lower edge in FIG. 1) does not overlap the CF board 11a, that is, front and back surfaces of the portion are uncovered. The mounting section for the drivers 12 and the rigid-flex board 13 (arrangement section for panel-side input lines 18 and panel-side terminals 19 for flexible board) is allocated in this portion. Alignment films 11d, 11e are formed on inner surfaces of the substrates 11a, 11b, respectively, for aligning liquid crystal molecules in the liquid crystal layer 11c. Polarizing plates 11f, 11g are bonded to outer surfaces of the substrates 11a, 11b, respectively.

Figure 4:
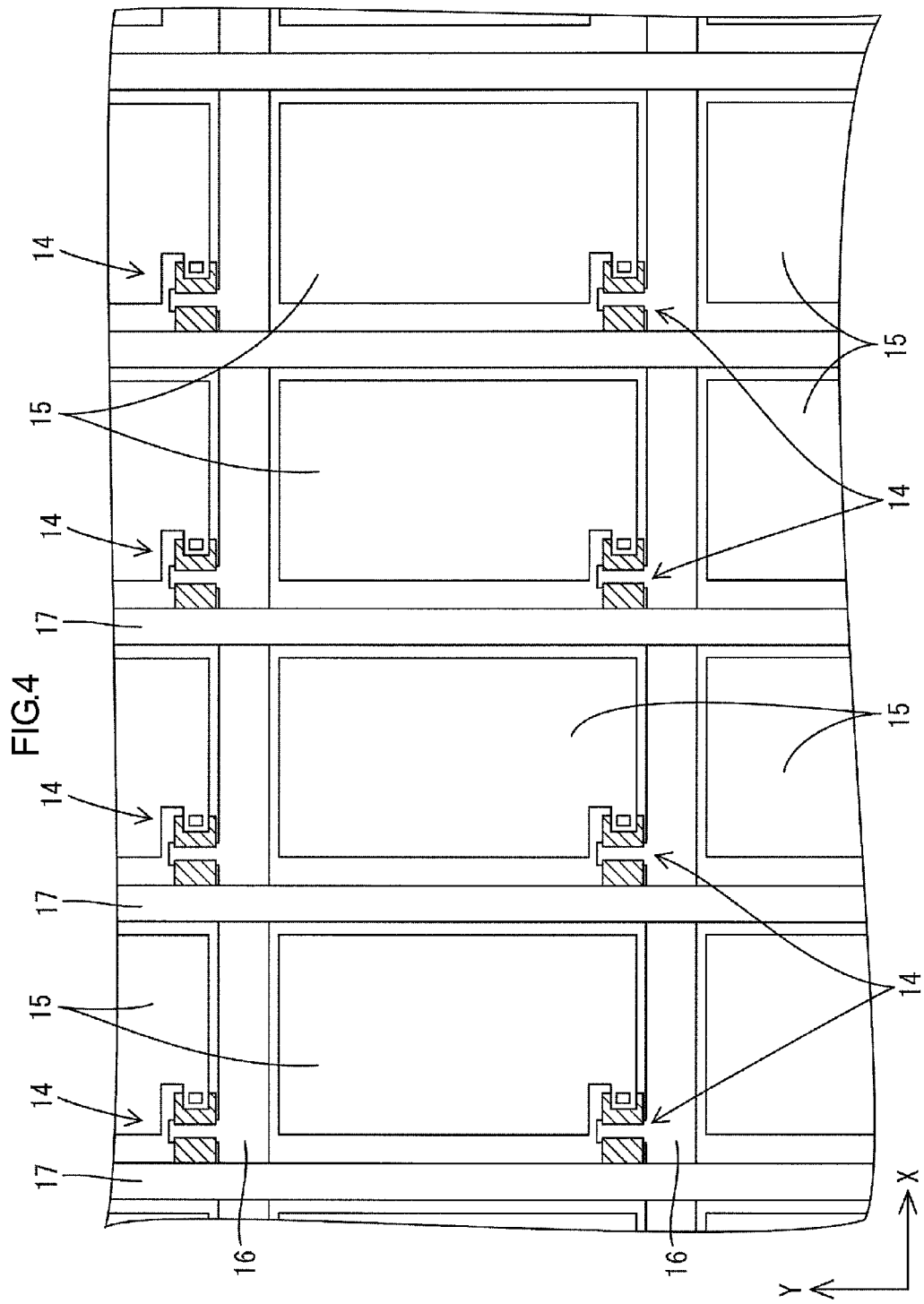
FIG. 4 is a magnified plan view of an array board of the liquid crystal panel, illustrating a plan-view configuration.

Next, configurations of the array board 11b and the CF board 11a inside of the display area AA will be described in detail. As illustrated in FIGS. 3 and 4, a large number of thin film transistors (TFTs) 14 and a large number of pixel electrodes 15 are arranged in a matrix on the inner surface of the array board 11b (a surface facing the liquid crystal layer and the CF board 11a). The TFTs 14 are switching components. Gate lines 16 and source lines 17 are arranged in a matrix around the TFTs 14 and the pixel electrodes 15. The gate lines 16 and the source lines 17 are made of metal material (conducting material). Insulation layers are arranged at intersections between the gate lines 16 and the source lines 17. The gate lines 16 and the source lines 17 are connected to gate electrodes and source electrodes of the TFTs 14, respectively. The pixel electrodes 15 are connected to drain electrodes of the TFTs 14. The pixel electrode 15 has a portrait shape (a rectangular shape) in a plan view. The pixel electrode 15 is made of transparent electrode materials such as indium tin oxide (ITO) and zinc oxide (ZnO). Capacitance lines (not illustrated) may be arranged on the array board 11b, parallel to the gate lines 16 and crossing the pixel electrodes 15 with an insulating layer therebetween.

Figure 5:
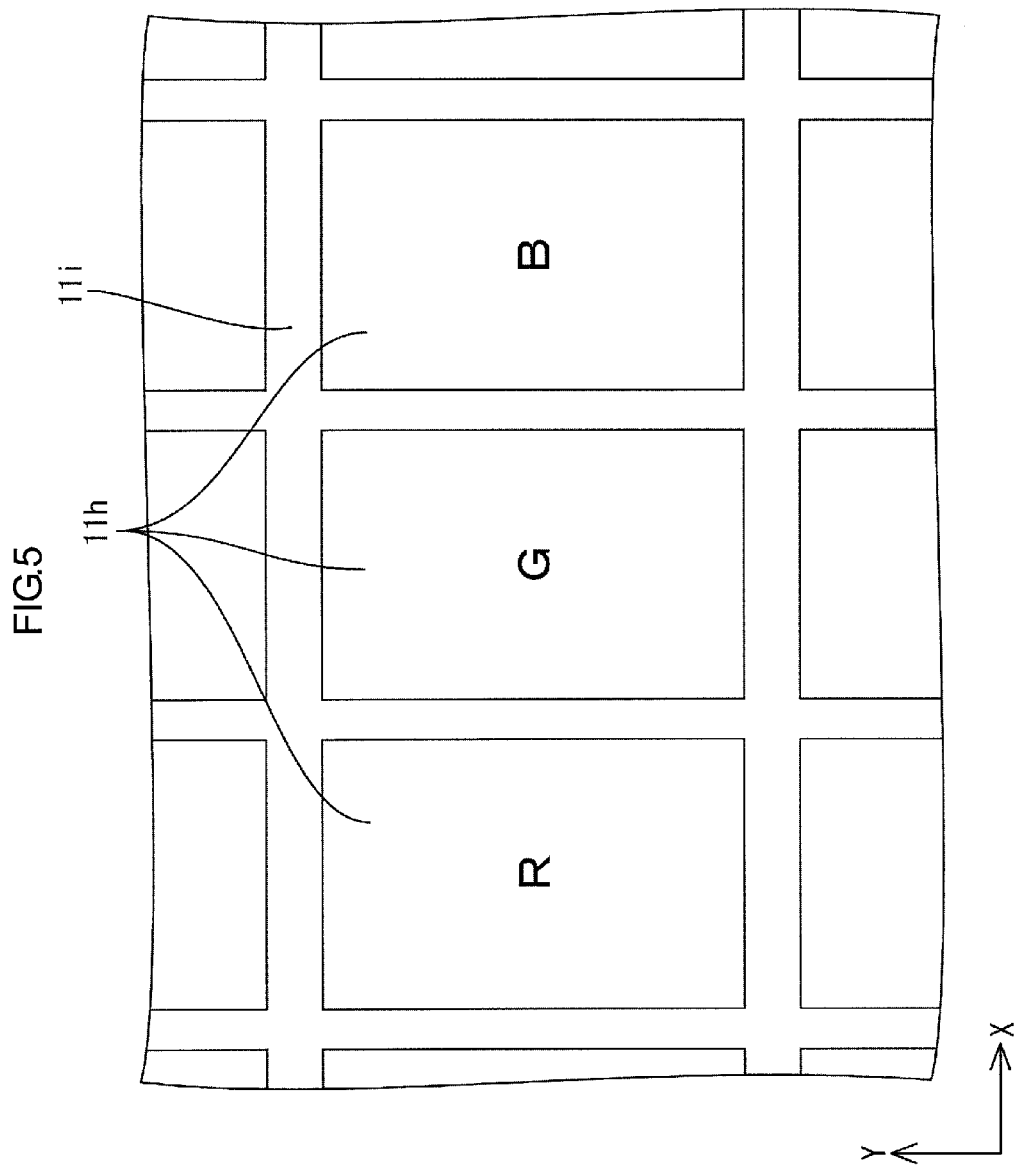
FIG. 5 is a magnified plan view of a CF board of the liquid crystal panel, illustrating a plan-view configuration.

As illustrated in FIGS. 3 and 5, the CF board 11a includes a color filter 11h. The color filter 11h includes a large number of color sections colored in red (R), green (G), and blue (B). The color sections are arranged parallel to each other and overlap the pixel electrodes 15 disposed on the array board 11b in a plan view. A light blocking layer (a black matrix) 11i is arranged between the color sections of the color filter 11h. The light blocking layer 11i has a grid-like shape and has a function for reducing color mixing. The light blocking layer 11i is disposed corresponding to the gate lines 16 and the source lines 17 in a plan view. Counter electrodes 11j are arranged on surfaces of the color filter 11h and the light blocking layer 11i.

The drivers 12 are LSI chips each including a driving circuit therein. The drivers 12 are configured to operate based on power and reference potential supplied from a main circuit board, which is a power source, via the rigid-flex board 13. The drivers 12 process image signals transmitted from the main circuit board, which is a signal source, via the rigid-flex board 13, and generate output signals, and send the output signals to the display area AA of the liquid crystal panel 11. As illustrated in FIG. 2, the drivers 12 have a landscape rectangular shape in a plan view. The drivers 12 are directly mounted to the array board 11b of the liquid crystal panel 11 in the non-display area NAA, that is, mounted using chip on glass (COG) technology. The long-side direction of each driver 12 corresponds with the X-axis direction and the short-side direction thereof corresponds with the Y-axis direction. The drivers 12 (twelve drivers in FIG. 2) are arranged in line in the non-display area NAA along a direction in which the mounting section extends, that is, along the X-axis direction. The drivers 12 are arranged at substantially equal intervals from an end of the long dimension of the liquid crystal panel 11 to the other end thereof.

Figure 8:
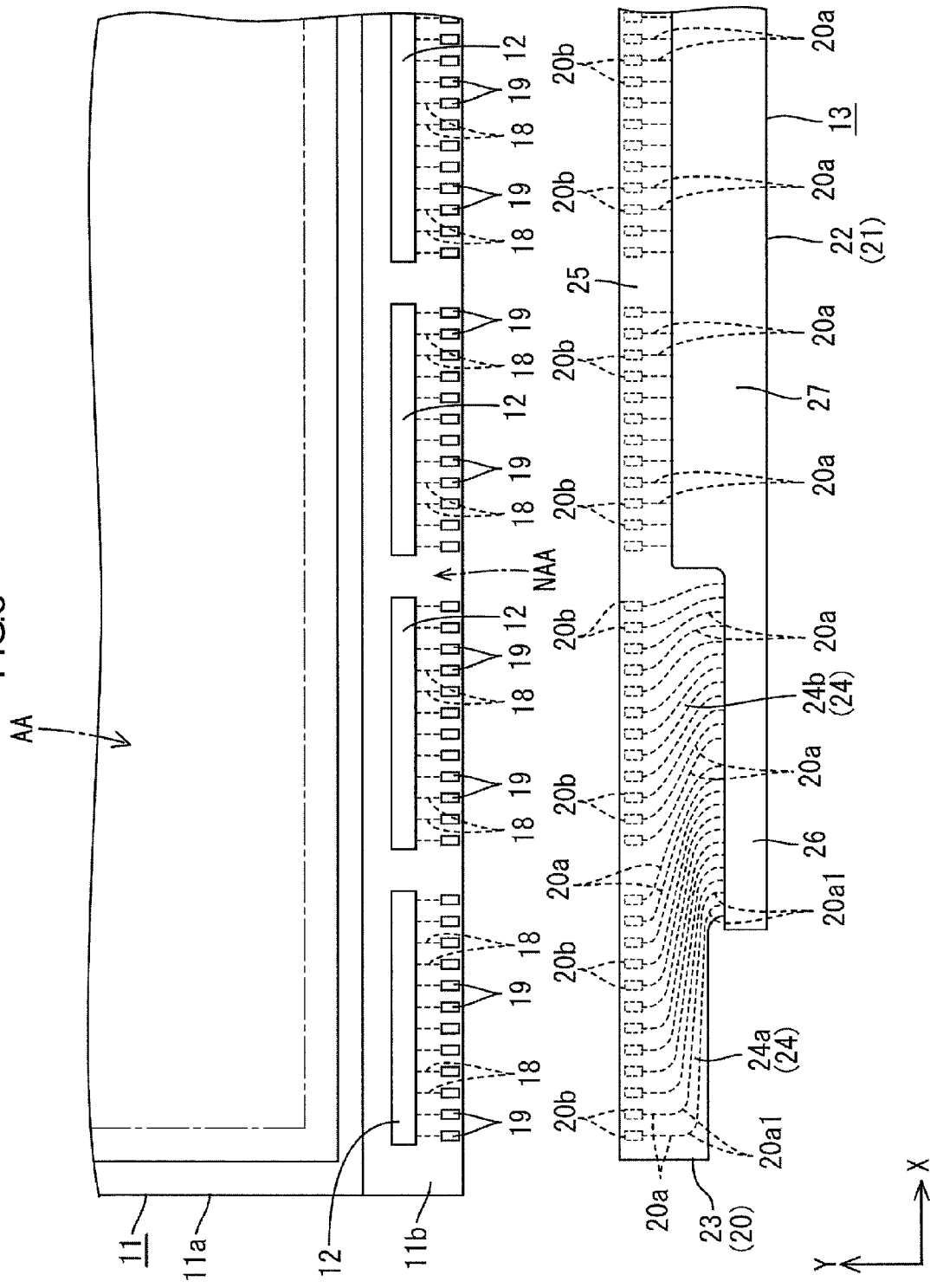
FIG. 8 is a magnified plan view illustrating the liquid crystal panel and the rigid-flex board before connected to each other.

The non-display area NAA on which the drivers 12 are mounted includes panel-side input and output terminals for drivers (not illustrated), panel-side output lines (not illustrated), and panel-side input lines 18, as illustrated in FIG. 2. The panel-side input and output terminals for drivers are connected to input and output terminals of the drivers 12 (not illustrated), respectively. The panel-side output lines connect the panel-side output terminals for drivers and the display area AA. The panel-side input lines 18 connect the panel-side input terminals for drivers and the rigid-flex board 13. The panel-side input lines 18 extend straightly in a direction in which the driver 12 and the rigid-flex board 13 are arranged (i.e. in the Y-axis direction, in a first direction). As illustrated in FIG. 8, ends of the respective panel-side input lines 18 (i.e. an end opposite from an end for the driver 12) are connected to panel-side terminals 19 for flexible board. The panel-side input lines 18 and the panel-side terminals 19 for flexible board are arranged in the non-display area NAA in the array board 11b. Specifically, the panel-side input lines 18 and the panel-side terminals 19 for flexible board are arranged along one of long edges of the array board 11b where the rigid-flex board 13 is connected (i.e., in the X-axis direction, in a second direction perpendicular to the first direction). The panel-side input lines 18 are at intervals from one another, and the panel-side terminals 19 for flexible board are at intervals from one another. The panel-side input and output terminals for driver and the panel-side terminals 19 for flexible board are uncovered to connect with the drivers 12 and the rigid-flex board 13, respectively. In contrast, the panel-side output lines and the panel-side input lines 18 are covered with an unillustrated insulation film.

As illustrated in FIG. 2, the rigid-flex board 13 is directly connected to the non-display area NAA of the liquid crystal panel 11 and thus electrically connected to the liquid crystal panel 11. The rigid-flex board 13 is further electrically connected to the main board of the computer body NPB via unillustrated wiring elements. The rigid-flex board 13 receives image signals transmitted from the main board and transmits the image signals to the drivers 12 mounted on the liquid crystal panel 11. The rigid-flex board 13 extends along the edge of the non-display area NAA of the liquid crystal panel 11 to which the rigid-flex board 13 is connected. A dimension in length of the rigid-flex board 13 is substantially smaller than a length of the long edges of the liquid crystal panel 11. That is, a dimension in width of the rigid-flex board 13 corresponds to a direction in which the liquid crystal panel 11 and the rigid-flex board 13 are arranged (i.e., the Y-axis direction, the first direction). The dimension in length of the rigid-flex board 13 corresponds to a direction that is along a plate surface of the liquid crystal panel 11 and perpendicular to the direction in which the liquid crystal panel 11 and the rigid-flex board 13 are arranged (i.e., the X-axis direction, the second direction).

Figure 6:
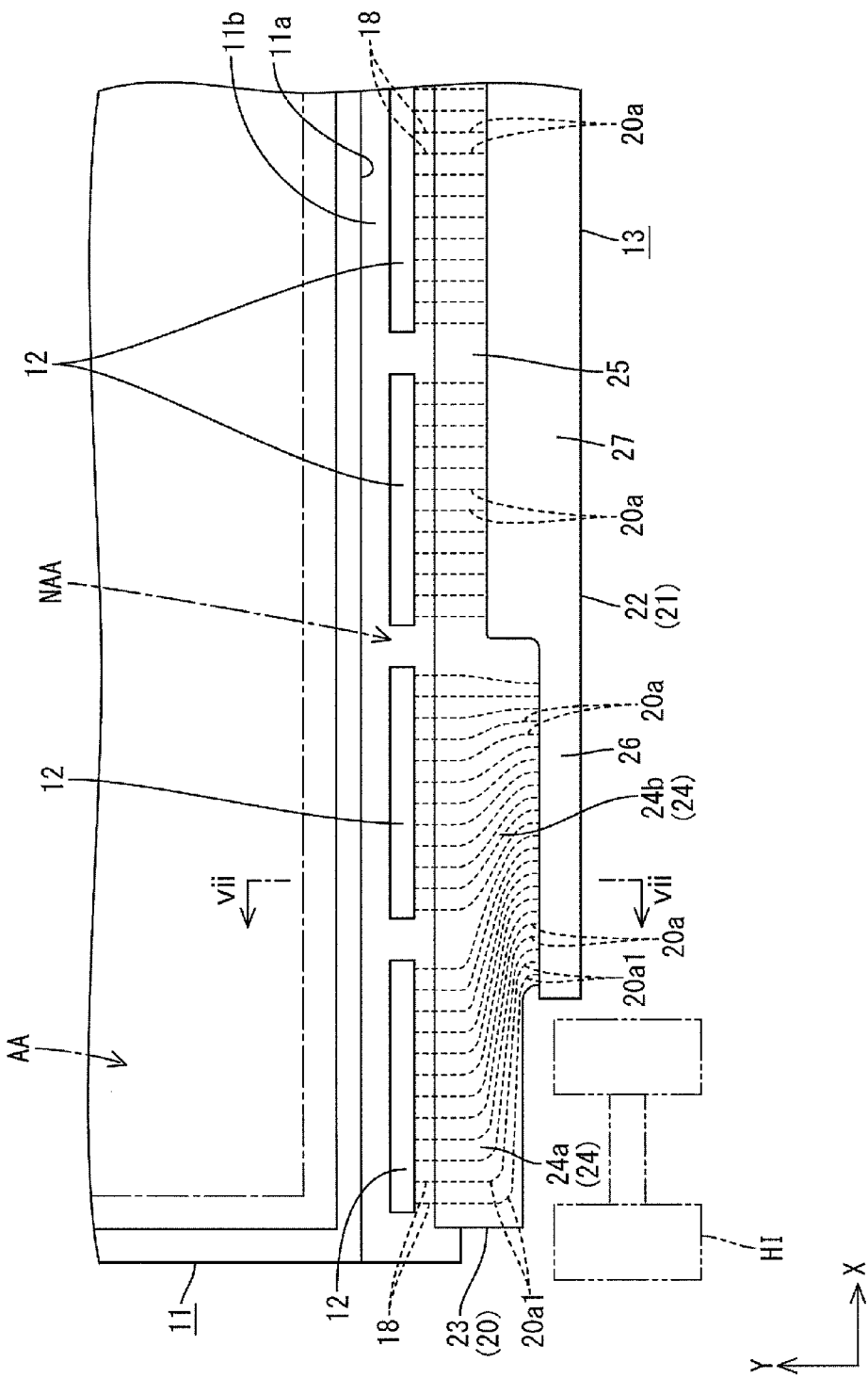
FIG. 6 is a magnified plan view of the liquid crystal panel and the rigid-flex board.
Figure 7:
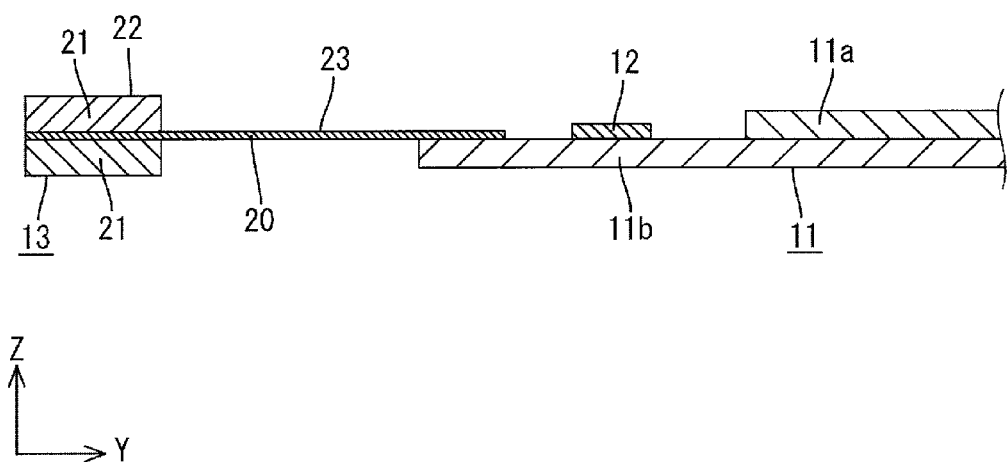
FIG. 7 is a cross-sectional view cut along line vii-vii in FIG. 6.

As described in FIGS. 6 and 7, the rigid-flex board 13 includes a flexible member 20 having flexibility and a pair of rigid members 21 having rigidity with little flexibility. The pair of the rigid members 21 sandwich a portion of the flexible member 20. The flexible member 20 includes a film-like base member made of a synthetic resin having insulation property (e.g., polyimide resin) and having elasticity. The flexible member 20 further includes a number of flexible-side lines 20a formed in the base member. The flexible-side lines 20a form a flexible-side tracing pattern. As illustrated in FIG. 8, the flexible member 20 includes flexible-side terminals 20b. Each flexible-side terminal 20b is at an end of the flexible-side line 20a closer to the liquid crystal panel 11 (an end opposite from an end closer to the rigid member 21) and is connected to the liquid crystal panel 11. The flexible-side terminals 20b are uncovered to connect with the liquid crystal panel 11. The flexible-side lines 20a are substantially covered with an unillustrated insulation film. The flexible member 20 including the film-like base member has higher flexibility than the rigid members 21 so that is easily curved or bent.

As illustrated in FIGS. 6 and 7, the rigid member 21 includes a substrate that is made of paper phenol or glass epoxy resin and has a predetermined plate thickness. Power components and electronic components (circuit elements) are mounted on the substrate of the rigid member 21. The power components are configured to supply power and reference potential to the driver 12. The electronic components are configured to control transmission of image signals to the liquid crystal panel 11. A rigid-side tracing pattern (not illustrated) including a number of rigid-side trace lines are formed on the substrate of the rigid member 21. The rigid member 21 includes a number of unillustrated via-holes. The rigid-side tracing patterns of the rigid member 21 are electrically connected to the flexible-side tracing patterns of the flexible member 20 (more specifically, connected to ends of the flexible-side line 20 away from the flexible-side terminals 20b) through the via-holes. The rigid member 21 has a plate-like shape having the thickness larger than a thickness of the flexible member 20. The rigid member 21 has rigidity with little flexibility and thus is less likely to curve or bend compared to the flexible member 20.

As illustrated in FIGS. 2, 6, and 7, the rigid-flex board 13 includes a rigid board 22 and a flexible board 23. The rigid board 22 has a stacking structure and includes a pair of the rigid members 21 and a portion of the flexible member 20 sandwiched by the pair of the rigid members 21. The flexible board 23 includes a portion of the flexible board 23 not sandwiched by the pair of the rigid members 21. That is, the rigid board 22 includes the rigid members 21 and a portion of the flexible member 20 that overlaps the rigid members 21 in a plan view. In contrast, the flexible board 23 only includes a portion of the flexible member 20 that does not overlap the rigid members 21. One of edge portions of the Y-axis dimension of the flexible board 23 (the upper side in FIG. 2) is connected with the non-display area NAA of the liquid crystal panel 11 and another one of the edge portions thereof (the lower side in FIGS. 2 and 6) is connected with the rigid board 22. The flexible board 23 and the rigid board 22 are electrically connected by the flexible-side pattern (the flexible-side lines 20a) which is included in the flexible member 20 that extends from the flexible board 23 to the rigid board 22. One of the rigid members 21 of the rigid board 22 includes unillustrated connectors that are connected with tracing elements (not illustrated) and thereby electrically connected to the main board of the computer body NPB. The flexible-side terminals 20b of the flexible board 23 are electrically and mechanically connected with the panel-side terminals 19 for flexible board of the liquid crystal panel 11 via unillustrated anisotropic conductive films (ACF) (see FIG. 8). In this embodiment, the rigid board 22 of the rigid-flex board 13 is a signal supplying board and the flexible board 23 is a flexible board.

Positions of the two hinges HI, which are disposed at the connecting portion between the computer body NPB and the liquid crystal display device 10, with respect to the liquid crystal panel 11 and the rigid-flex board 13 will be described. As illustrated in FIG. 2, the hinges HI are each positioned on an outer side with respect to a corner of the liquid crystal panel 11 in the Y-axis direction (i.e., the lower side in FIG. 2), more specifically, on the outer side with respect to the corner near the edge of the liquid crystal panel where the rigid-flex board 13 is connected. Further, the hinges HI are positioned on the outer sides with respect to the respective ends of the long dimension of the rigid-flex board 13 in the X-axis direction (the left or right side in FIG. 2).

Figure 22:
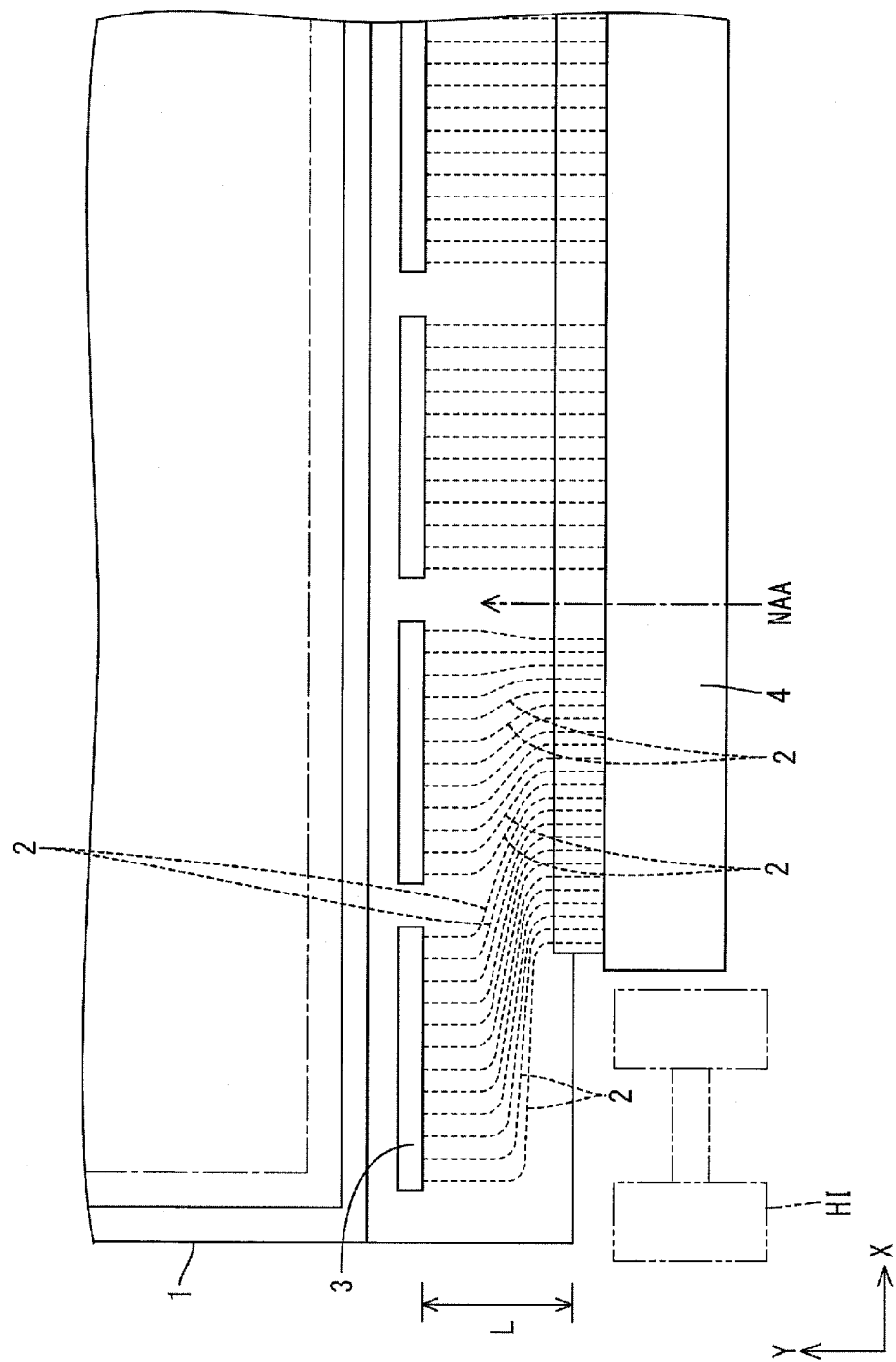
FIG. 22 is a magnified plan view of a liquid crystal panel and a rigid-flex board according to a comparative example.

The liquid crystal panel 11 having higher definition (higher resolution) includes a larger number of lines 16 and 17. Accordingly, the number of the drivers 12 increases and the number of the panel-side input lines 18 for connecting the drivers 12 to the rigid-flex board 13 also increases. In such a case, as illustrated in FIG. 2, some drivers 12 are arranged close to ends of the X-axis dimension of the non-display area NAA of the liquid crystal panel 11. Accordingly, the long dimension of the rigid-flex board 13 tends to be increased in the X-axis direction to be connected to the panel-side input lines 18 that extend from the drivers 12 located closer to the ends of the rigid-flex board 13. The hinges HI are arranged on an outer side with respect to the rigid-flex board 13 in the X-axis direction to sandwich the rigid-flex board 13 therebetween. Therefore, the hinges HI may be in contact with the rigid-flex board 13 having a longer dimension and this may be a problem. A configuration that avoids the contact between the hinges HI and the rigid-flex board 13 will be described with reference to a reference example in FIG. 22. As illustrated in FIG. 22, panel-side input lines 2 may be routed from drivers 3 toward a rigid-flex board 4 in a non-display area NAA of a liquid crystal panel 1 such that the panel-side input lines 2 are gathered together from an end of liquid crystal panel 1 in the X-axis direction toward the middle of liquid crystal panel 1. According to this configuration, the long dimension of the rigid-flex board 4 can be decreased and thus the contact between a hinge HI and the rigid-flex board 4 may be less likely to occur. However, in this configuration, a large area L may be required in the non-display area NAA of the liquid crystal panel 1 with respect to the Y-axis direction (i.e., in a direction in which the liquid crystal panel 1 and the rigid-flex board 4 is arranged) for routing the panel-side input lines 2. Accordingly, the dimension of the non-display area NAA is increased in the Y-axis direction. This results in increase of the frame size of the liquid crystal display device and fails to achieve higher definition and a smaller frame in size.

In this embodiment, as illustrated in FIGS. 2 and 6, a dimension of the flexible board 23 in the X-axis direction (the second direction) is relatively larger than the corresponding dimension of the rigid board 22. The flexible board 23 includes flexible end portions (an end portion) 24 and a flexible middle portion (a middle portion) 25. Each flexible end portion 24 includes at least an outer portion 24a located on an outer side with respect to the rigid board 22 in the X-axis direction (a first end portion). The flexible middle portion 25 is located about the middle of the flexible board 23 with respect to the flexible end portions 24. A dimension of each flexible end portion 24 in the Y-axis direction (the first direction) is relatively larger than a corresponding dimension of the flexible middle portion 25. Thus, the flexible board 23 has the dimension in the X-axis direction (the long dimension) larger than the corresponding dimension of the rigid board 22. Therefore, the flexible board 23 has a larger mount area in the X-axis direction connected to the liquid crystal panel 11, and such a configuration easily deals with the increased number of the flexible-side lines 20a according to increased definition of the liquid crystal panel 11, compared to a configuration in which a flexible board and a rigid board have the same dimension in the X-axis direction. The dimension of the rigid board 22 in the X-axis direction is smaller than the corresponding dimension of the flexible board 23. Thus, the rigid board 22 is less likely to contact with the hinges HI located on the outer side with respect to the rigid board 22 in the X-axis direction. More specifically, the X-axis dimension of the flexible board 23, namely, the long dimension thereof, is slightly smaller than the long dimension of the liquid crystal panel 11, and substantially equal to a long dimension of an area of the liquid crystal panel 11 where the drivers 12 are mounted. The long dimension of the rigid board 22 is smaller than the corresponding dimension of the flexible board 23, and smaller than the area of the liquid crystal panel 11 where the drivers 12 are mounted. The difference in dimension between the flexible board 23 and the rigid board 22 is substantially the same or slightly smaller than a total length dimension of spaces in which the hinges HI are arranged.

The flexible end portion 24, which includes at least the outer portion 24a located on the outer side with respect to the rigid board 22 in the X-axis direction, has a dimension in the Y-axis direction (a width dimension) that is slightly larger than a corresponding dimension of the flexible middle portion 25, which is arranged about the middle of the flexible board 23 in the X-axis direction with respect to the flexible end portion 24. The flexible end portion 24 having relatively a larger width is used for an area where the flexible-side lines 20a are routed and therefore, the frame size of the liquid crystal display device 10 can be reduced. More details will be described below. The flexible board 23 is larger in the X-axis dimension (the long dimension) than the corresponding dimension of the rigid board 22. Therefore, in designing a tracing pattern of the flexible-side lines 20a on the flexible board 23, it is necessary to route the flexible-side lines 20a so as to gather together from flexible-side terminals 20b toward the rigid board 22 in the Y-axis direction and gather together from the end of the flexible board 23 toward the middle of the flexible board 23 in the X-direction. As described above, the flexible end portion 24 of the flexible board 23 is larger in the Y-axis dimension than the corresponding dimension of the flexible middle portion 25. Therefore, the flexible end portion 24 has an adequate space for routing and gathering the flexible-side lines 20a together toward the middle of the flexible board 23. If the flexible end portion and the flexible middle portion of the flexible board are equal in dimension in the Y-axis direction, it is necessary to provide a routing space on the liquid crystal panel 11 for routing the panel-side input lines 18 from the end of the liquid crystal panel 11 toward the middle of the liquid crystal panel 11 in the X-axis direction. Compared to such a configuration, the configuration according to this embodiment reduces the width of the non-display area NAA of the liquid crystal panel 11 and accordingly reduces the frame size of the liquid crystal display device 10. Thus, the display device having higher definition with a smaller frame size is obtained. The flexible-side lines 20a formed in the flexible end portion 24 of the flexible board 23 include curved portions 20a1 at intermediate portions thereof so that the flexible-side lines 20a gather from the end of the flexible board 23 toward the middle of the flexible board 23 in the X-axis direction.

In this embodiment, as illustrated in FIG. 6, the flexible end portions 24 of the flexible board 23 includes second end portions 24b in addition to the first end portions 24a, each of which is located on the outer side with respect to the rigid board 22 in the X-axis direction. Each second end portion 24b is closer to the middle of the flexible board 23 with respect to the corresponding first end portion 24a and is adjacent to the first end portion 24a. The first end portion 24a does not overlap the rigid board 22 in the X-axis direction while the second end portion 24b overlaps the rigid board 22 in the X-axis direction. The first end portion 24a and the second end portion 24b constitute the flexible end portion 24 that has the dimension relatively larger in the Y axis-direction. The flexible end portion 24 in the X-axis direction overlaps the two drivers 12 located closer to each end of the liquid crystal panel 11 in the X-axis direction. The flexible-side terminals 20b and the flexible-side lines 20a in the flexible end portion 24 are connected to the panel-side terminals 19 for flexible board that are connected to the two of the drivers 12 via the panel-side input lines 18 (see FIG. 8). The first end portion 24a of the flexible end portion 24 is closer to the end of the flexible board 23 and not directly connected with the rigid board 22. In contrast, the second end portion 24b of the flexible end portion 24 is closer to the middle of the flexible board 23 and directly connected with the rigid board 22. The flexible-side lines 20a that are connected with the flexible-side terminals 20b in the first end portion 24a are routed from the first end portion 24a to the second end portion 24b. According to this configuration, the area with a larger dimension in the X-axis direction is provided in the flexible end portion 24 of the flexible board 23 for routing the flexible-side lines 20a. Thus, this configuration is preferable for the liquid crystal panel 11 having higher definition while the liquid crystal display device 10 has a smaller frame in size.

As illustrated in FIG. 6, the flexible end portion 24 of the flexible board 23 includes a tracing area in which tracing patterns of the flexible-side lines 20a are formed. The tracing area has a dimension in the Y-axis direction that is substantially constant over an entire area of the flexible end portion 24. Specifically, the width of the flexible end portion 24 is substantially constant and does not change from the end of the flexible board 23 in the X-axis direction toward the middle of the flexible board 23 and the flexible end portion 24 does not include any slits. Accordingly, a width of the tracing area in the flexible end portion 24 is substantially constant over the entire area, that is, the tracing area does not include a locally narrow portion in its area ranging from the end of the flexible board 23 toward the middle thereof in the X-axis direction. According to such a configuration, even if the tracing pattern is formed in the tracing area with higher density due to the increased definition of the liquid crystal panel 11, such a tracing pattern with higher density can be easily formed in the flexible end portion 24. Thus, this configuration is further preferable to the liquid crystal panel 11 having higher definition.

As illustrated in FIG. 6, the rigid board 22 includes a rigid end portion 26 (an end signal supply portion) and a rigid middle portion 27 (a middle signal supply portion). The rigid end portion 26 is connected to the flexible end portion 24. The rigid middle portion 27 is connected to the flexible middle portion 25. A dimension of the rigid end portion 26 in the Y-axis direction (the first direction) is smaller than a dimension of the rigid middle portion 27 in the Y-axis direction. The difference in dimension in the Y-axis direction between the rigid end portion 26 and the rigid middle portion 27 is substantially equal to the difference in dimension in the Y-axis direction between the flexible end portion 24 and the flexible middle portion 25. The rigid end portion 26 and the rigid middle portion 27 are flush with each other at an edge of the rigid board 22 away from the flexible board 23 (a lower edge in FIGS. 2 and 6). That is, no step-like shapes are formed at the edge of the rigid board 22 opposite from the edge closer to of the flexible board 23. According to this configuration, the rigid board 22 is less likely to be in contact with other components including the hinges HI. The rigid end portion 26 and the rigid middle portion 27 form a step-like shape at the edge of the rigid board 22 closer to the flexible board 23 (an upper edge in FIGS. 2 and 6). Specifically, the rigid end portion 26 is indented toward the rigid board 22 (away from the liquid crystal panel 11) with respect to the rigid middle portion 27. In contrast, the flexible end portion 24 and the flexible middle portion 25 are flush with each other at an edge of the flexible board 23 close to the liquid crystal panel 11 (an edge of the flexible board 23 away from the rigid board 22). Thus, the flexible end portion 24 and the flexible middle portion 25 are connected to the liquid crystal panel at the same position in the Y-axis direction. According to this configuration, the flexible board 23 can be connected to the liquid crystal panel 11 using an automated device and thus the flexible board 23 is effectively and easily connected. The flexible end portion 24 and the flexible middle portion 25 form a step-like shape at an edge of the flexible board 23 closer to the rigid board 22. That is, the flexible end portion 24 protrudes toward the rigid board 22 with respect to the flexible middle portion 25.

As described above, the liquid crystal display device (a display device) 10 according to this embodiment includes the liquid crystal panel (a display panel) 11, the rigid board (a signal supplying board) 22, and the flexible board (a flexible board) 23. The liquid crystal panel 11 includes the display area AA for displaying images and the non-display area NAA other than the display area AA. The rigid board 22 is configured to be connected to an external signal source. The flexible board 23 has flexibility and includes the edge portion connected to the non-display area NAA of the liquid crystal panel 11 and other edge portion connected to the rigid board 22 to relay signals from the rigid board 22. The liquid crystal panel 11 and the flexible board 23 are arranged in the first direction (the Y-axis direction). The direction perpendicular to the first direction and along the plate surface of the liquid crystal panel 11 is the second direction (the X-axis direction). The flexible board 23 has a dimension in the second direction larger than the dimension of rigid board 22 in the second direction. The flexible board 23 includes the flexible end portions (an end portion) 24 and the flexible middle portion (a middle portion) 25. The flexible end portion 24 includes at least the first end portion 24a that is located on the outer side with respect to the rigid board 22 in the second direction. The flexible middle portion 25 is located about the middle of the flexible board 23 with respect to the flexible end portion 24 in the second direction. The flexible end portion 24 has a dimension in the first direction larger than a dimension of the flexible middle portion 25 in the first direction.

In this embodiment, the one of the edge portions of the flexible board 23 is connected to the non-display area NAA of the liquid crystal panel 11 and the other one of the edge portions of the flexible board 23 is connected to the rigid board 22. Therefore, signals transmitted from the external signal source to the rigid board 22 are transmitted to the liquid crystal panel 11 via the flexible board 23. The liquid crystal panel 11 and the flexible board 23 are arranged in the first direction, and the second direction is perpendicular to the first direction and along the plate surface of the liquid crystal panel 11. The dimension of the flexible board 23 in the second direction is larger than the dimension of the rigid board 22 in the second dimension in the second direction. According to this configuration, the portion of the flexible board 23 connected to the liquid crystal panel 11 increases in size compared to the rigid board 22 and the rigid board 22 having the same dimension in the second direction. This configuration is preferable to the liquid crystal panel 11 having a larger number of tracing lines thereon in accordance with the improvement in the definition (resolution) of the liquid crystal panel 11. The dimension of the rigid board 22 in the second direction is smaller than the dimension of the flexible board 23. Therefore, the rigid board 22 is less likely to contact with other components arranged outside the rigid board 22 in the second direction.

The flexible end portion 24 that includes at least the first end portion 24a located on the outer side with respect to the rigid board 22 in the second direction has the dimension in the first direction larger than that of the flexible middle portion 25 located about the middle of the flexible board 23 in the second direction with respect to the flexible end portion 24. The flexible end portion 24 is used for as an area where tracing lines are patterned and therefore, a frame size of the liquid crystal display device 10 can be reduced. Reasons of this reduction will be described in detail. The flexible board 23 is larger in dimension in the second direction than the corresponding dimension of the rigid board 22. Therefore, in designing a tracing pattern in the flexible board 23, it is necessary to route the tracing lines so as to gather together from the end portion of the flexible board 23 toward the middle of the flexible board 23 in the second direction. As described above, the flexible end portion 24 of the flexible board 23 is larger in dimension in the first direction than the flexible middle portion 25. Thus, the flexible end portion 24 has an adequate space for routing and gathering the tracing lines together toward the middle of the flexible board 23. If the flexible end portion and the flexible middle portion are equal in dimension in the first direction, it is necessary to provide a routing space on the liquid crystal panel 11. Compared to the above configuration, the configuration according to this embodiment reduces the width of the non-display area NAA, and accordingly reduces the frame size of the liquid crystal display device 10. Thus, the display device having higher definition with a smaller frame in size is obtained.

The flexible end portion 24 of the flexible board 23 further includes the second end portion 24b that is adjacent to the first end portion 24a located on the outer side with respect to the rigid board 22 in the second direction. By using the flexible end portion 24 of the flexible board 23 as an area for routing the tracing pattern, the area with a larger dimension in the second direction is obtained for routing the tracing pattern. Thus, this configuration is preferable for the liquid crystal display device 10 having higher definition with smaller a frame in size.

The flexible board 23 is connected with the rigid board 22 at the second end portion 24b that is adjacent to the first end portion 24a of the flexible end portion 24 located on the outer side with respect to the rigid board 22 in the second direction. The first end portion 24a located on the outer side with respect to the rigid board 22 in the second direction has a dimension in the first direction that is constant from the end of the flexible board 23 toward the middle of the flexible board 23 in the second direction. The flexible board 23 tends to have a tracing pattern with higher density as the liquid crystal panel 11 obtains higher definition. As described above, the first end portion 24a that is located on the outer side with respect to the rigid board 22 in the second direction has the dimension in the first direction that is constant from the end of the flexible board 23 toward the middle of the flexible board 23 in the second direction. If a slit is formed in the first end portion that is located on the outer side with respect to the rigid board in the second direction, the dimension of the first end portion in the first direction is locally narrow in its area ranging from the end toward of the flexible board 23 toward the middle thereof in the second direction. Compared to such a configuration, the configuration of this embodiment is preferable for forming the tracing pattern with high density, and thus preferable for the liquid crystal panel 11 having higher definition.

The rigid board 22 includes the rigid end portions (an end portion) 26 and the rigid middle portion (a middle portion) 27. The rigid end portions 26 are connected to the flexible end portions 24 of the flexible board 23. The rigid middle portion 27 is connected to the flexible middle portion 25 of the flexible board 23. The rigid end portion 26 has a dimension in the first direction smaller than a dimension of the rigid middle portion 27 in the first direction. As an example, a rigid board may have a rigid end portion and a rigid middle portion that are equal in dimension in the first direction, and a flexible end portion and a flexible middle portion of a flexible board may be connected at different positions of the liquid crystal panel 11 in the first direction. Compared to such a configuration, a position of the liquid crystal panel 11 to which the flexible end portion 24 is connected and a position of the liquid crystal panel to which the flexible middle portion 25 is connected are close to each other in the first direction according to this embodiment. As another example, a rigid board may have a rigid end portion and a rigid middle portion that are equal in dimension in the first direction, and the rigid board may have a step-like shape at an edge thereof away from the flexible board. Compared to such a configuration, the rigid board 22 of this embodiment is less likely to have such a step-like edge.

The edge of the rigid end portion 26 away from the flexible board 23 and the edge of the rigid middle portion 27 away from the flexible board 23 are flush with each other. According to this configuration, the rigid board 22 is less likely to have the step-like shape at the edge thereof away from the flexible board 23. Thus, the rigid board 22 is less likely to contact with other components.

The flexible end portion 24 and the flexible middle portion 25 included in the flexible board 23 are connected at the same position of the liquid crystal panel 11 with respect to the first direction. According to this configuration, the flexible board 23 can be connected to the liquid crystal panel 11 using an automated device and thus the flexible board 23 is efficiently and easily connected.

The rigid board 22 and the flexible board 23 are an integrated member as the rigid-flex board 13. The rigid-flex board 13 includes the flexible member having flexibility and a pair of the rigid members 21 having rigidity. The pair of the rigid members 21 and a portion of the flexible member 20 sandwiched by the pair of the rigid members 21 constitutes the rigid board 22. The other portion of the flexible member 20 constitutes the flexible board 23. The flexible end portion 24, which includes at least the first end portion 24a that is located on the outer side with respect to the rigid board 22 in the second direction, is larger in dimension in the first direction than the middle flexible board, which is located in the middle of the flexible board in the second direction with respect to the flexible end portion 24. In this configuration, the rigid board 22 and the flexible board 23 are the integrated member as the rigid-flex board 13. Compared to a configuration in which the rigid board and the flexible board are separate members and they are mechanically interconnected by thermal compression, connecting defects are less likely to occur and interconnection resistance is reduced. In this embodiment, the flexible board 23 is larger in dimension in the second direction than the rigid board 22. Compared to a configuration in which the flexible board 23 has a dimension in the second direction equal to that of the rigid board 22, the flexible board 23 has a larger area to be connected to the liquid crystal panel 11. This configuration is preferable to the liquid crystal panel 11 having higher definition. In contrast, the rigid board 22 is smaller in dimension in the second than the flexible board 23. Thus, the rigid board 22 is less likely to contact with components that are arranged on the outer side with respect to the rigid board 22 in the second direction. Furthermore, the flexible end portion 24, which includes at least the first end portion 24a that is located on the outer side with respect to the rigid board 22 in the second direction, is larger in dimension in the first direction than the flexible middle portion 25, which is located in the middle of the flexible board 23 with respect to the flexible end portion 24 in the second direction. By using the flexible end portion 24 as an area for routing the tracing pattern, the frame size of the liquid crystal display panel can be reduced.

The liquid crystal panel 11 includes the panel-side input lines (signal transmission traces) 18 in the area of the non-display area NAA between the display area AA and the flexible board 23. The panel-side input lines 18 are configured to transmit signals sent through the rigid board 22 and the flexible board 23 to the display area AA. In addition to this configuration, by routing tracing lines in the flexible end portion 24 of the flexible board 23 such that the tracing lines gather from the end of the flexible board 23 toward the middle of the flexible board 23, the panel-side input lines 18 in the liquid crystal panel 11 are not necessarily routed such that the lines 18 gather from the end of the non-display area NAA toward the middle of the non-display area NAA. Accordingly, it is not necessary to allocate a larger space for the panel-side input lines 18 in the non-display area NAA of the liquid crystal panel 11. Thus, this configuration enables the liquid crystal panel 11 to have high definition while the liquid crystal display device 10 has a smaller frame size.

The display panel of the display device is the liquid crystal panel 11 including a pair of substrates 11a and 11b with the liquid crystal layer 11c sealed between the substrates 11a and 11b. Applications of such a display device, namely, the liquid crystal display device 10, include electronic devices, such as personal digital assistances (e.g., laptop computers), mobile phones, and portable video game players.

Second Embodiment

A second embodiment will be described with reference to FIGS. 9 to 11. The second embodiment includes a flexible board 123 having a dividing structure. Other configurations are similar to the first embodiment and thus configurations, functions, and effects similar to those will not be described.

Figure 9:
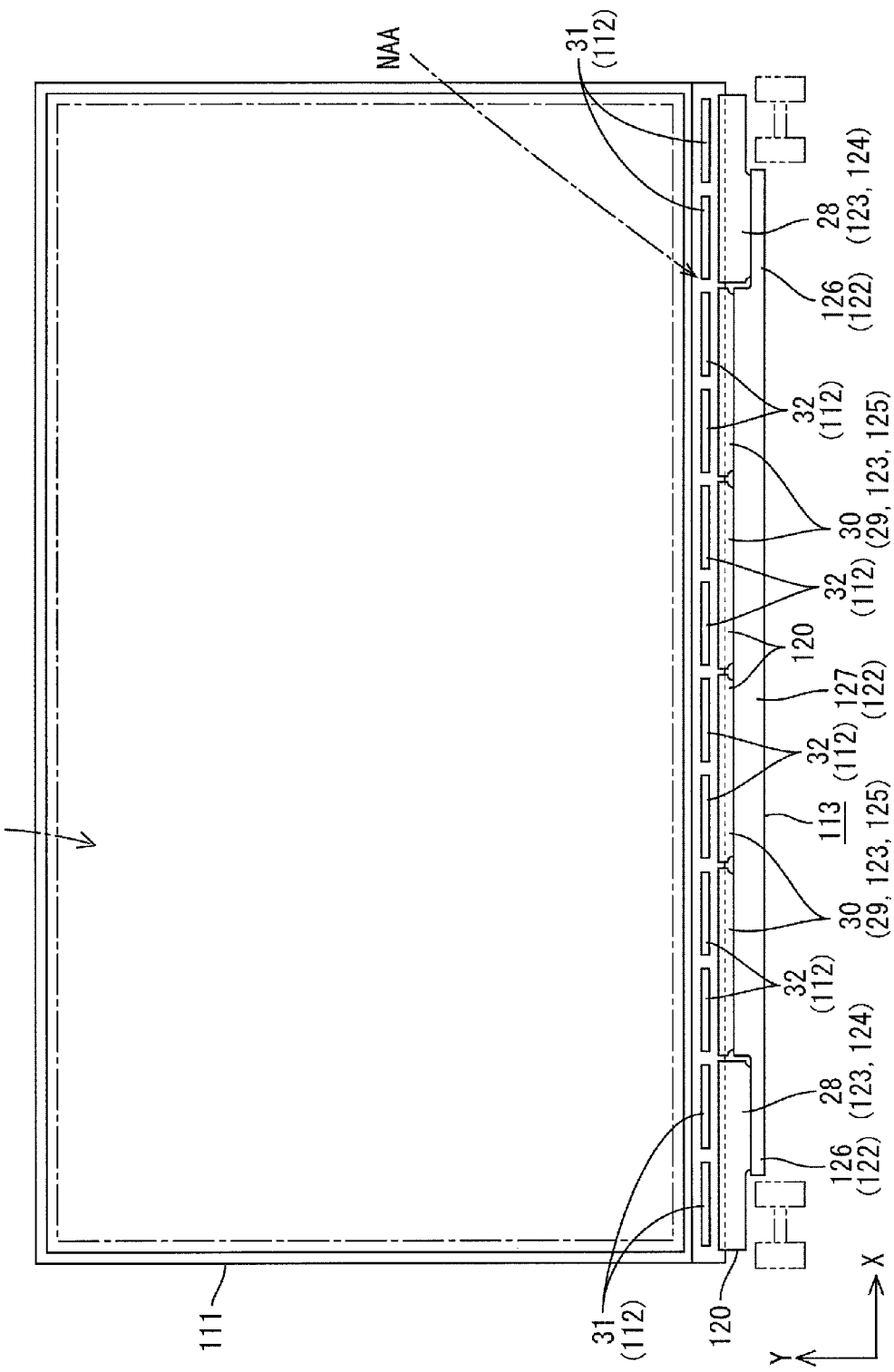
FIG. 9 is a plan view of a liquid crystal panel and a rigid-flex board according to a second embodiment.

As illustrated in FIG. 9, a flexible member 120 that constitutes a rigid-flex board 113 of this embodiment are divided in the X-axis direction into multiple separate pieces (six in FIG. 9). Specifically, the flexible board 123 includes divided flexible end portions 28 (a divided flexible end board) and a divided flexible middle portion 29 (a divided flexible middle board). The divided flexible end portions 28 constitute flexible end portions 124. The divided flexible middle portion 29 constitutes a flexible middle portion 125. Some of the separate pieces of the flexible member 120 (four in FIG. 9) which constitute the divided flexible middle portion 29 are divided flexible middle pieces 30 (a divided flexible middle piece). The divided flexible end portions 28 are positioned at ends of the flexible board 123. The divided flexible middle portion 29 is positioned in between the divided flexible end portions 28 in the X-axis direction. The four of the divided flexible middle pieces 30 included in the divided flexible middle portion 29 are arranged at equal intervals in the X-axis direction.

Figure 10:
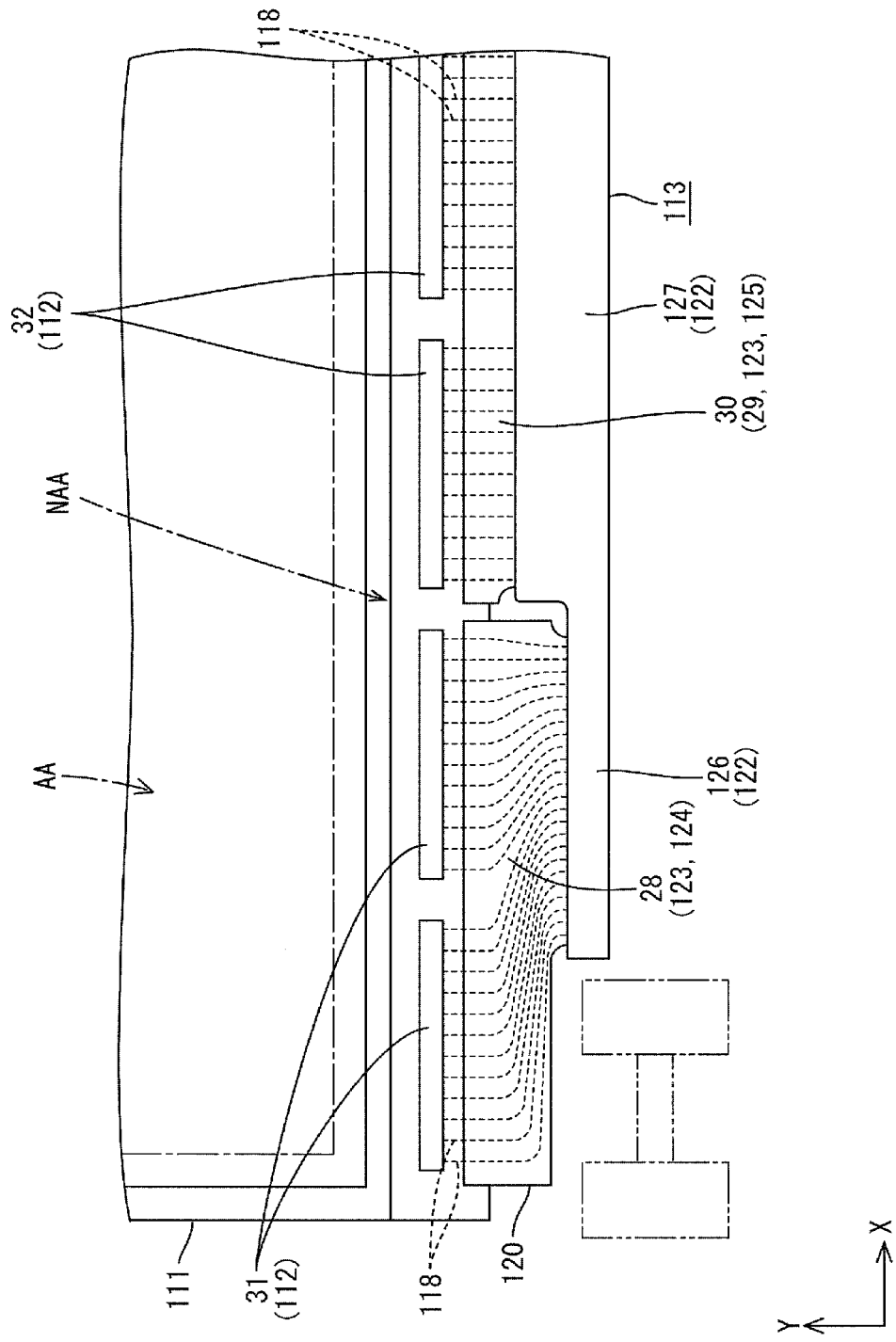
FIG. 10 is a magnified plan view of the liquid crystal panel and the rigid-flex board.
Figure 11:
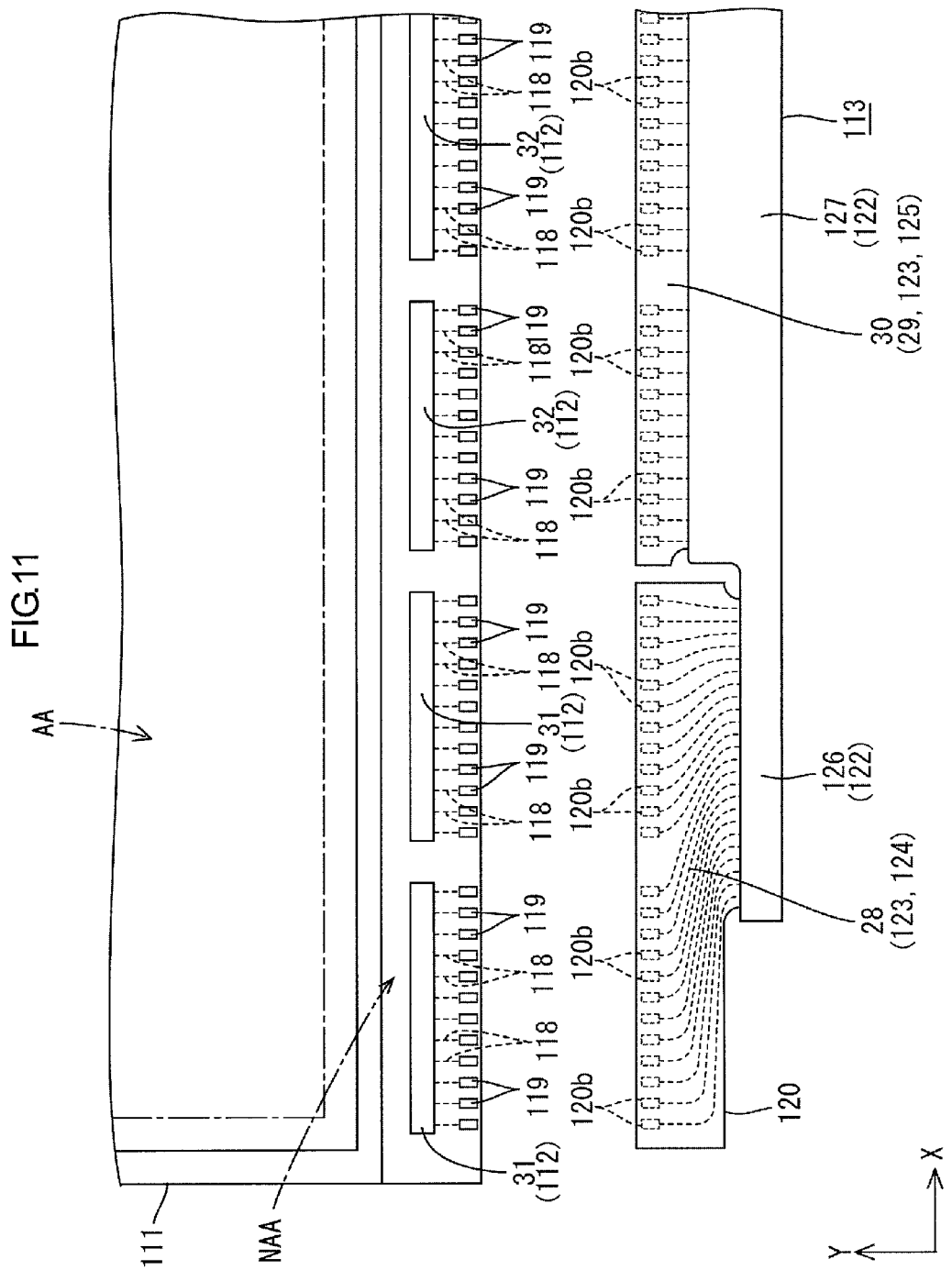
FIG. 11 is a magnified plan view illustrating the liquid crystal panel and the rigid-flex board before connected to each other.

As illustrated in FIG. 10, a border between the divided flexible end portion 28 and the divided flexible middle portion 29 included in the flexible board 123 corresponds to a border between a rigid end portion 126 and a rigid middle portion 127 of a rigid board 122. The divided flexible end portions 28 are connected to the rigid end portions 126. The divided flexible middle portion 29 is connected to the rigid middle portion 127. A group of drivers 112 are mounted to the liquid crystal panel 111. As illustrated in FIG. 9, the group of drivers 112 includes end-drivers 31 located close to ends of an X-axis dimension of a liquid crystal panel 111 and middle-drivers 32 about a middle of the X-axis dimension of the liquid crystal panel 111. Each of the divided flexible end portions 28 is connected to two of the end-drivers 31. The divided flexible middle portion 29 is connected to eight of the middle-drivers 32. Each of the four divided flexible middle pieces 30 included in the divided flexible middle portion 29 is connected to every two of the eight middle drivers 32.

Next, functions and effects of the above configuration will be described. Each of the divided flexible end portions 28 and the divided flexible middle portion 29 thermally expands or contracts, individually when the thermal environment changes. The amount of expansion or contraction of each divided portion is based on the size of each divided flexible portion 28, 29. The amount of thermal expansion or contraction in each divided flexible portion 28, 29 is relatively smaller than the amount of thermal expansion or contraction in the flexible board 23 of the first embodiment that is not divided. When the rigid-flex board 113 is mounted on the liquid crystal panel 111, each of the divided flexible portions 28, 29 included in the flexible board 123 is positioned with respect to the liquid crystal panel 111 in the X-axis direction by using alignment marks (positioning member), which are not illustrated, and the flexible board 123 is mounted on the liquid crystal panel 11 with thermal compression bonding. Accordingly, the amount of the thermal expansion or contraction of each of the divided flexible portions 28, 29 caused by the thermal expansion or the thermal contraction is relatively small. Therefore, the mount position of each divided flexible portion 28, 29 with respect to the liquid crystal panel 111 is proper. Accordingly, a number of flexible-side terminals 120b included in the divided flexible portions 28, 29 are appropriately connected to a number of panel-side terminals 119 for flexible board that are included in the liquid crystal panel 111. Thus, defects are less likely to occur. The divided flexible middle portion 29 includes multiple divided flexible middle pieces 30. In this configuration, the amount of thermal expansion and construction during thermal compression further decreases in each divided flexible middle piece 30. Thus, the divided flexible middle pieces 30 can be connected to more appropriate positions in the liquid crystal panel 11. In this embodiment, the flexible board 123 is divided into at least the flexible end portions 124 and the flexible middle portion 125, and a dimension of the flexible end portion 124 in the Y-axis direction is different from that of the flexible middle portion 125. In other words, a dimension of the divided flexible end portion 28 in the Y-axis direction is different from that of the divided flexible middle portion 29. However, the dimension of individual divided flexible portion 28, 29 in the Y-axis direction is substantially constant. Thus, the production cost of the divided flexible portions 28, 29 reduces.

The divided flexible end portion 28 of the flexible board 123 having a relatively larger dimension in the Y-axis direction is connected to the rigid end portion 126 of the rigid board 122 having a relatively smaller dimension in the Y-axis direction. The divided flexible middle portion 29 of the flexible board 123 having a relatively smaller dimension in the Y-axis direction is connected to the rigid middle portion 127 of the rigid board 122 having a relatively larger dimension in the Y-axis direction. According to this configuration, each of the divided flexible portions 28, 29 is not connected with each of the rigid middle portion 127 and the rigid end portion 126 of the divided flexible portions 28, respectively. Each of the end drivers 31 connected with the divided flexible end portion 28 processes signals transmitted from the divided flexible end portion 28. Each of the middle drivers 32 connected with the divided flexible middle portion 29 processes signals transmitted from the divided flexible middle portion 29. That is, the divided flexible end portion 28 and the divided flexible middle portion 29 are connected to the end drivers 31 and the middle drivers 32, respectively. According to this configuration, panel-side input lines 118 of a tracing pattern can be efficiently arranged in the non-display area NAA to connect the divided flexible portions 28, 29 to the respective drivers 31, 32. This configuration is preferable for the lighting device having higher definition with a smaller frame size.

As is described above, the flexible end portions 124 and the flexible middle portion 125 of the flexible board 123 are at least separate from each other. The flexible board 123 includes the divided flexible end portions 28 (a divided flexible end board) corresponding to the flexible end portion 124, and the divided flexible middle portion 29 (a divided flexible middle board) corresponding to the flexible middle portion 125. According to this configuration, when the thermal environment changes and thermal expansion or contraction occurs in the divided flexible portions 28 and 29, each of the divided flexible end portions 28 and the divided flexible middle portion 29 individually expands or contracts. The amount of expansion and contraction of each divided flexible portion 28, 29 is based on the size of each divided flexible portion 28, 29. In comparison to a configuration in which the flexible board does not have a divided structure, the amount of the thermal expansion or contraction of each divided flexible portion 28, 29 is relatively smaller in this embodiment. During connecting the flexible board 123 to the liquid crystal panel 111 with thermal compression bonding, the divided flexible portion 28, 29 according to this embodiment expands or contracts due to the thermal compression but the amount of expansion or contraction is relatively small. Thus, each divided flexible portion is connected to a proper position of the liquid crystal panel 111. Further, the flexible end portions 124 and the flexible middle portion 125 of the flexible board 123 are at least separated from each other, and the dimension of the flexible end portions 124 in the first direction is different from the dimension of the flexible middle portion 125 in the first direction. That is, the divided flexible end portion 28 and the divided flexible middle portion 29 have different dimensions in the first direction but a dimension of each individual portion in the first direction is constant. Accordingly, the production cost of the divided flexible portions 28 and 29 reduces.

The divided flexible middle portion 29 includes multiple separate pieces as the divided flexible middle pieces 30 (a divided flexible middle piece). According to this configuration, the amount of thermal expansion or contraction of the divided flexible middle pieces 30 included in the divided flexible middle portion 29 is relatively smaller than that of a divided flexible middle portion without a divided configuration. Thus, the amount of extension or contraction of the divided flexible middle pieces 30 further decreases during thermal compressing of the flexible board 123 to the liquid crystal panel 111. Thus, each divided flexible middle piece 30 is connected to a proper position of the liquid crystal panel 111.

The rigid end portion 126 of the rigid board 122, which is connected to the flexible end portion 124 of the flexible board 123, has a smaller dimension in the first direction than the rigid middle portion 127 of the rigid board 122, which is connected to the flexible middle portion 125 of the flexible board 123. The divided flexible end portion 28 of the flexible board 123 is connected to the rigid end portion 126 of the rigid board 122, and the divided flexible middle portion 29 is connected to the rigid middle portion 127 of the rigid board 122. According to this configuration, the divided flexible end portion 28 of the flexible board 123, which has a relatively larger dimension in the first direction, is connected to the rigid end portion 126 of the rigid board 122, which has a relatively smaller dimension in the first direction. Further, the divided flexible middle portion 29 of the flexible board 123, which has a relatively smaller dimension in the first direction, is connected to the rigid middle portion 127 of the rigid board 122, which has a relatively larger dimension in the first direction. According to this configuration, each of the divided flexible portions 28, 29 is less likely to be connected both of the rigid end portion 126 and the rigid middle portion 127 of the rigid board 122.

The liquid crystal display device includes the group of drivers (a driving circuit) 112 mounted on a portion of the non-display area NAA of the liquid crystal panel 111 between the display area AA and the flexible board 123. The group of drivers 112 is configured to process signals transmitted from the rigid board 122 and the flexible board 123, generate output signals, and send the output signals to the display area AA for driving the liquid crystal panel 111. The group of drivers 112 are arranged in the non-display area NAA along the second direction and include at least the end drivers 31 (an end driving circuit portion) and the middle drivers 32 (a middle driving circuit portion). The end drivers 31 (an end driving circuit portion) are connected to the divided flexible end portions 28. The middle drivers 32 are connected to the divided flexible middle portion 29. According to this configuration, the drivers 112 connected to the non-display area NAA of the liquid crystal panel 111 process signals transmitted from the rigid board 122 and the flexible board 123, generate output signals, and send the output signals to the display area AA and thus the liquid crystal panel 111 is driven. Signals transmitted by the divided flexible end portions 28 are processed by the end drivers 31 included in the drivers 112. Signals transmitted via the divided flexible middle portions 29 are processed by the middle drivers 32. As is described above, the drivers 112 include the end drivers 31 to which the divided flexible end portions 28 are connected and the middle drivers 32 to which the divided flexible middle portion 29 is connected. According to this configuration, the tracing pattern to connect the divided flexible portions 28 and 29 and the respective drivers 31 and 32 are effectively arranged in the non-display area NAA. This configuration is further preferable to the liquid crystal panel 11 having higher definition with a smaller frame size.

Third Embodiment

A third embodiment will be described with reference to FIG. 12. The third embodiment includes divided flexible end portions 228 that have a different shape from the ones in the second embodiment. Other configurations are similar to the second embodiment and thus configurations, functions, and effects similar to those will not be described.

Figure 12:
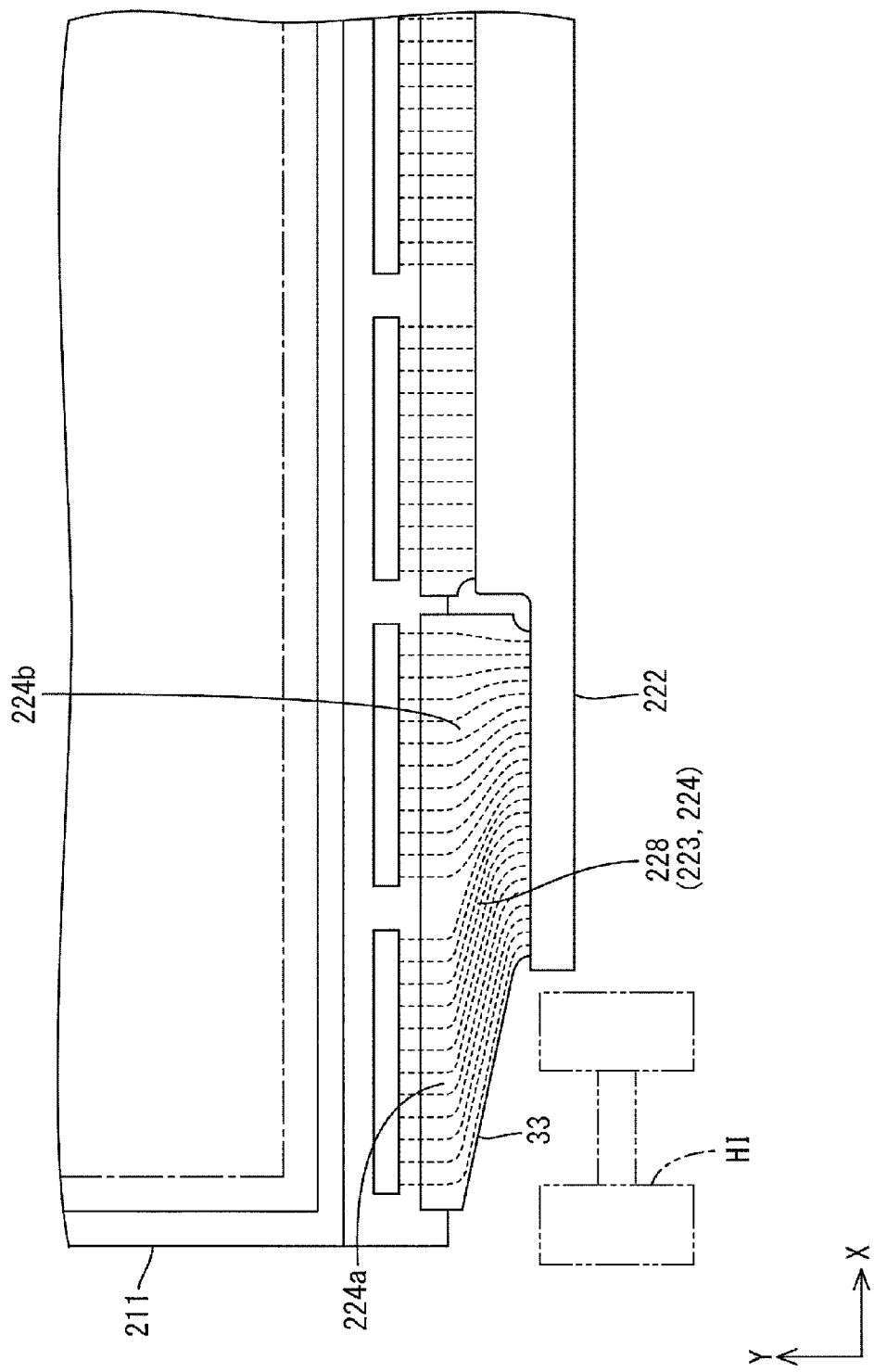
FIG. 12 is a magnified plan view of a liquid crystal panel and a rigid-flex board according to a third embodiment.

As illustrated in FIG. 12, the divided flexible end portion 228 according to this embodiment includes a first end portion 224a that is located on an outer side with respect to a rigid board 222 in the X-axis direction (the second direction). The first end portion 224a has an oblique portion 33 at one of edge portions of the first end portion 224a away from a liquid crystal panel 211. The oblique portion 33 has a slope-like shape (a linear oblique shape) and is oblique to the X-axis direction and the Y-axis direction in the plan view. The angle of the oblique portion 33 with respect to the X-axis direction and the Y-axis direction is constant. The oblique portion 33 extends in a range of the first end portion 224a between a portion of the first end portion 224a connected to the rigid board 222 and a portion of the first end portion 224a in front of the liquid crystal panel 211. That is, the oblique portion does not reach a portion of the first end portion 224a connected to the liquid crystal panel 211. With the oblique portion 33, the divided flexible end portion 228 is less likely to contact with a hinge HI adjacent to the divided flexible end portion 228. The first end portion 224a, which is on the outer side with respect to the rigid board 222 in the X-axis direction and includes the oblique portion 33, has a dimension in the Y-axis direction (the first direction) which gradually and continuously increases from the end toward the middle in the X-axis direction.

As is described above, according to this embodiment, the flexible board 223 includes a second end portion 224b that is adjacent to the first end portion 224a, which is located on the outer side with respect to the rigid board 222 in the second direction. The flexible board 223 is connected to the rigid board 222 at the second end portion 224b. The first end portion 224a, which is located on the outer side with respect to the rigid board 222 in the second direction, has the dimension in the first direction that increases from the end toward the middle in the second direction. As the liquid crystal panel 211 has higher definition, the flexible board 223 tends to have tracing patterns with higher density. As described earlier, the first end portion 224a, which is located on the outer side with respect to the rigid board 222 in the second direction, has the dimension in the first direction that increases from the end toward the middle in the second direction. If a slit is formed in the first end portion, which is located on the outer side with respect to the rigid board in the second direction, the dimension of the first end portion in the first direction is locally narrow in its area ranging from the end toward the middle in the second direction. Compared to such a configuration, the configuration of the third embodiment is preferable for forming the tracing patterns with high density, and thus further preferable for the liquid crystal panel 211 having higher definition.

The first end portion 224a, which is located on the outer side with respect to the rigid board 222 in the second direction and constitutes at least a portion of the flexible end portion 224 (i.e., the divided flexible end portion 228), includes the sloped edge at other edge of the flexible board 223. That is, the first end portion 224a of the flexible board 223 located on the outer side with respect to the rigid board 222 in the second direction includes the oblique portion at the other edge thereof, that is, an edge of the flexible board 223 away from the liquid crystal panel 211. According to this configuration, the flexible board 223 is less likely to contact with other components arranged adjacent to the flexible board 223 in the first direction.

Fourth Embodiment

Figure 13:
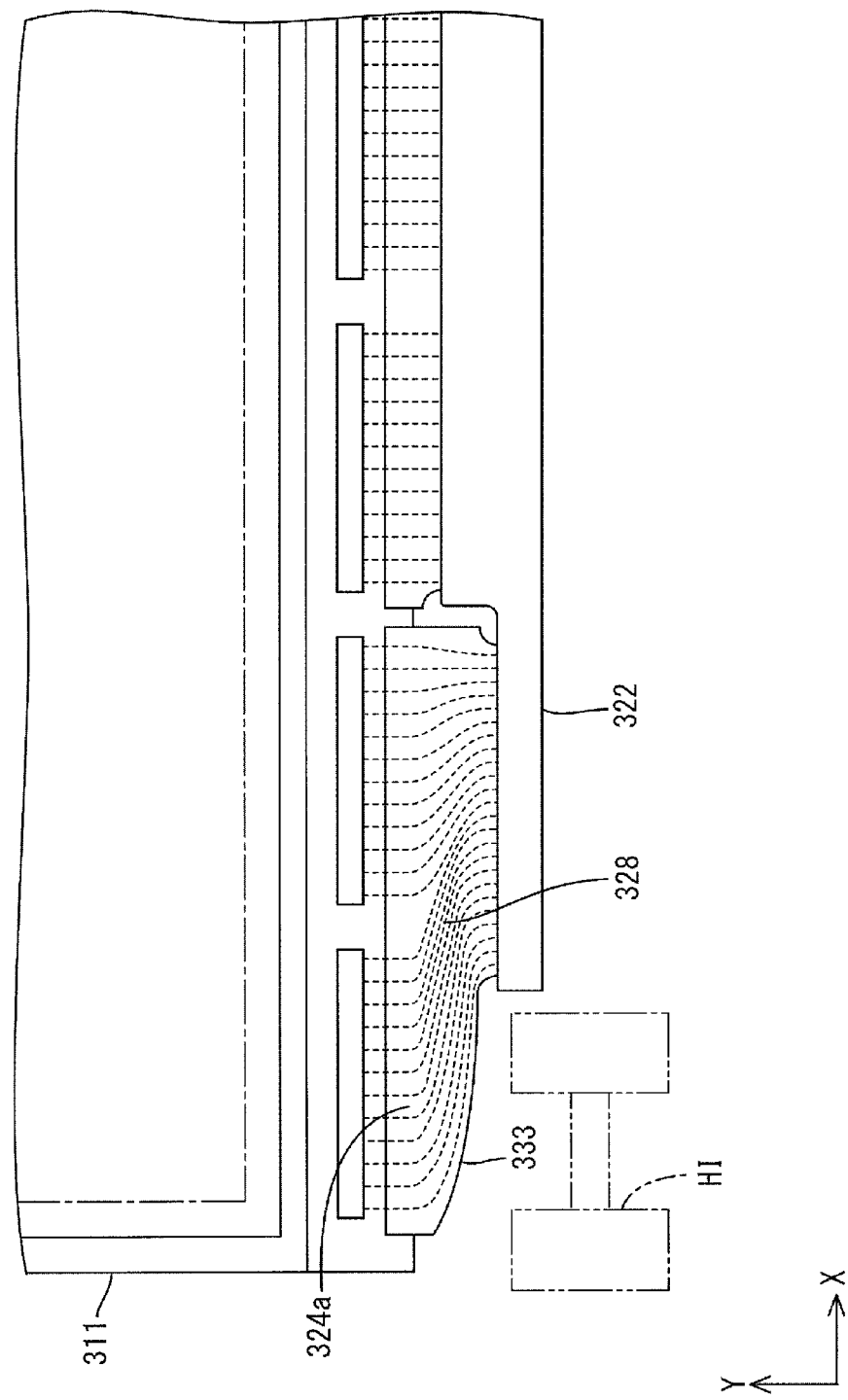
FIG. 13 is a magnified plan view of a liquid crystal panel and a rigid-flex board according to a fourth embodiment.

A fourth embodiment will be described with reference to FIG. 13. The fourth embodiment includes divided flexible end portions 328 that have a different planer shape from the ones in the third embodiment. Other configurations are similar to the third embodiment and thus configurations, functions, and effects similar to those will not be described.

Each of the divided flexible end portions 328 according to this embodiment includes a first end portion 324a that is located on an outer side with respect to a rigid board 322 in the X-axis direction. As illustrated in FIG. 13, the first end portion 324a includes an oblique portion 333 that has an arc shape in a plan view. Specifically, the oblique portion 333 has a arch-like shape and curves outward (forms a convexity) with respect to a line (a cord) which connects ends of the oblique portion 333, or in other words, curves away from the liquid crystal panel 11. Even with this configuration, similar to the third embodiment, an effect is obtained that the divided flexible end portions 328 are less likely to contact with the hinges HI.

Fifth Embodiment

Figure 14:
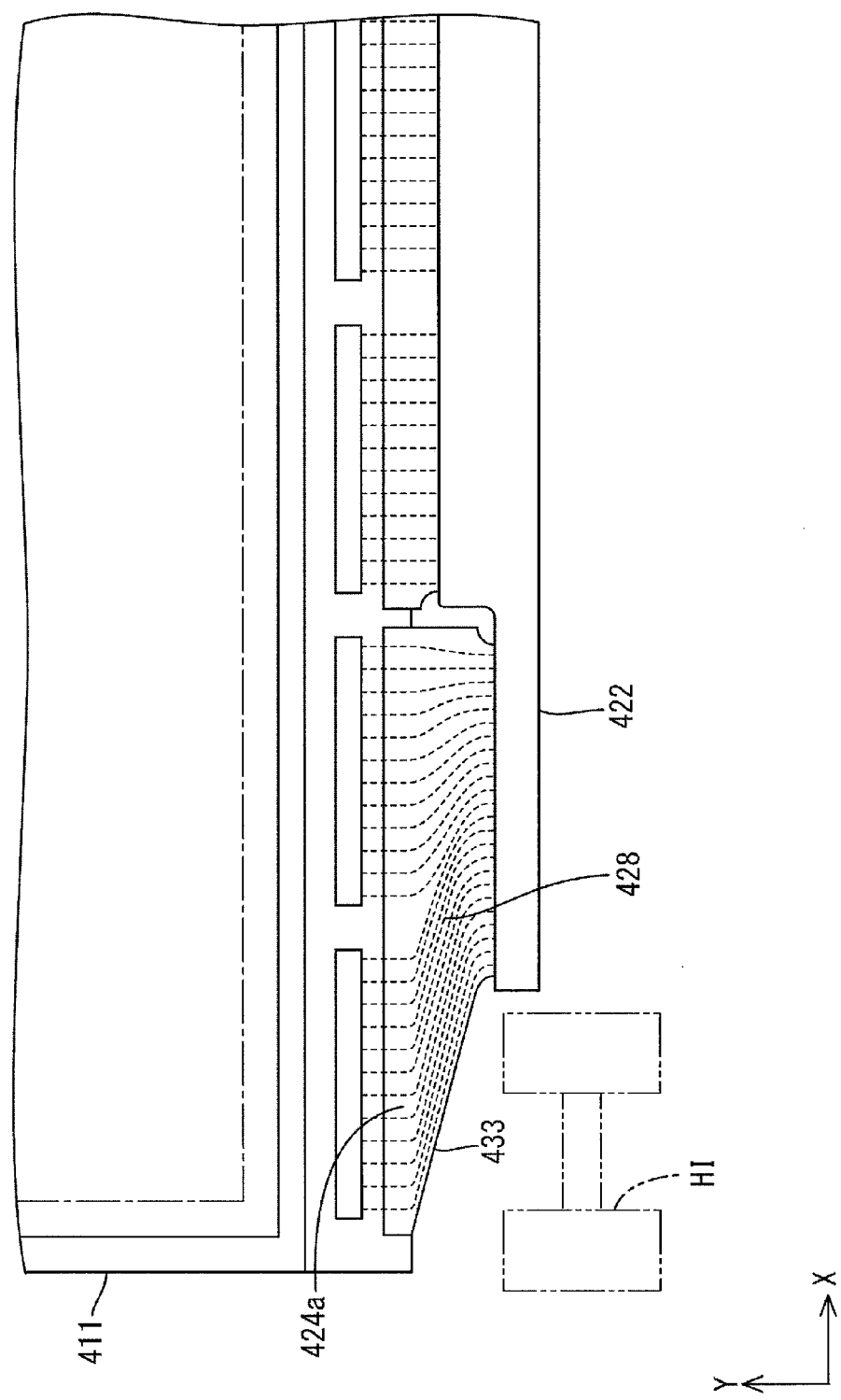
FIG. 14 is a magnified plan view of a liquid crystal panel and a rigid-flex board according to a fifth embodiment.

A fifth embodiment will be described with reference to FIG. 14. The fifth embodiment includes divided flexible end portions 428 that have a different planer shape from the ones in the third embodiment. Other configurations are similar to the third embodiment and thus configurations, functions, and effects similar to those will not be described.

Each of the divided flexible end portions 428 according to this embodiment includes a first end portion 424a that is located on an outer side with respect to a rigid board 422 in the X-axis direction. As illustrated in FIG. 14, the first end portion 424a includes an oblique portion 433 that extends from a portion of the first end portion 424a connected with the rigid board 422 to a portion of the first end portion 424a connected with a liquid crystal panel 411. That is, the oblique portion 433 is along an overall area of the first end portion 424a where the liquid crystal panel 411 does not overlap. Even with this configuration, similar to the third embodiment, an effect is obtained that the divided flexible end portions 428 are less likely to contact with the hinges HI.

Sixth Embodiment

A sixth embodiment will be described with reference to FIG. 15. The sixth embodiment includes a divided flexible middle portion 529 that has a non-divided structure, unlike the one in the second embodiment. Other configurations are similar to the second embodiment and thus configurations, functions, and effects similar to those will not be described.

Figure 15:
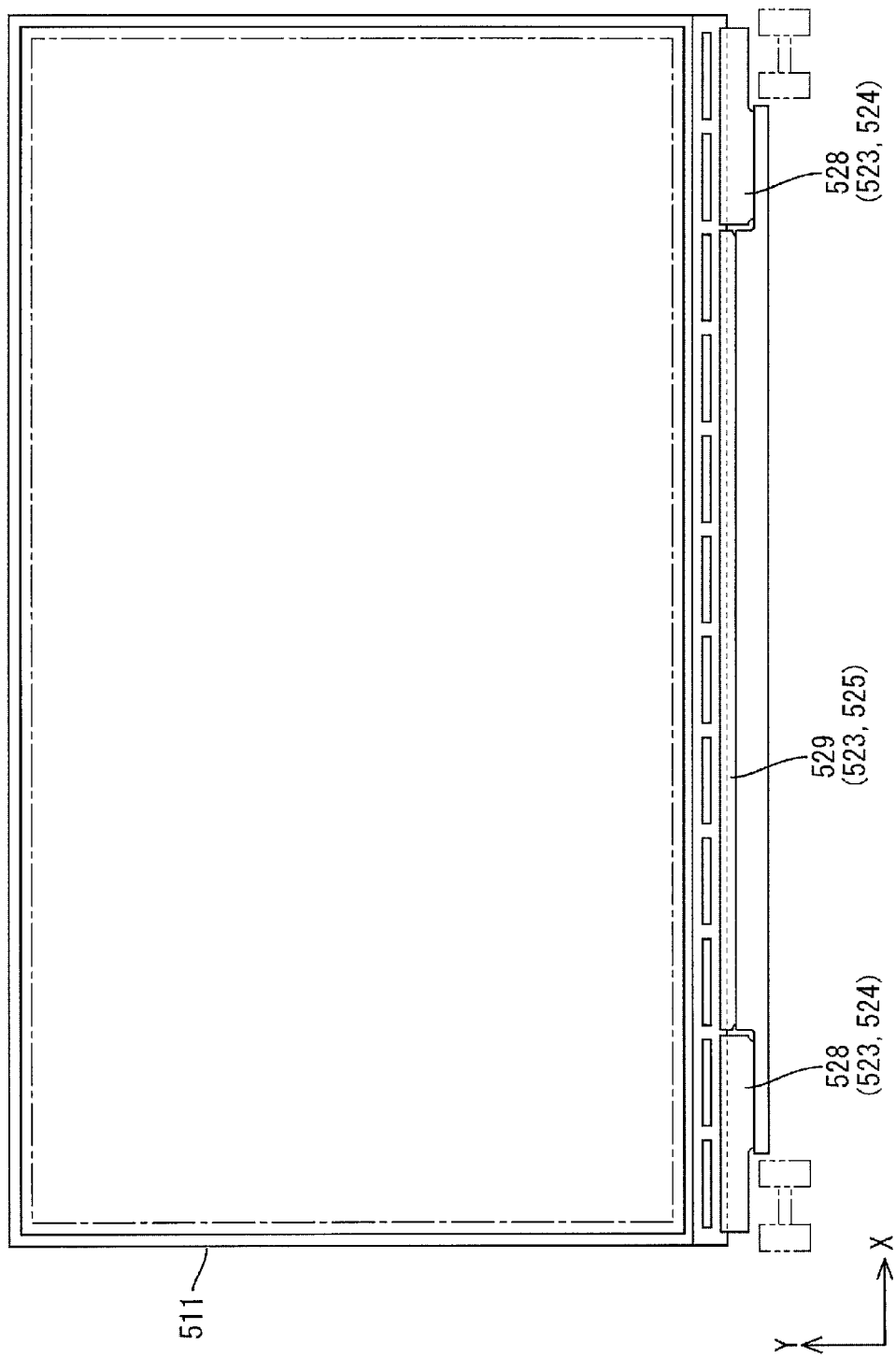
FIG. 15 is a plan view of a liquid crystal panel and a rigid-flex board according to a sixth embodiment.

As illustrated in FIG. 15, a flexible board 523 according to this embodiment includes a pair of divided flexible end portions 528 and one divided flexible middle portion 529. The divided flexible middle portion 529 is positioned in between the divided flexible end portions 528. The flexible board 523 is divided at borders between flexible end portions 524 and a flexible middle portion 525. That is, the divided flexible middle portion 529 has a non-divided structured and is not divided into pieces in the X-axis direction. The divided flexible middle portion 529 has a dimension in the Y-axis direction substantially constant across an entire length thereof. The divided flexible end portion 528 has a dimension in the Y-axis direction substantially constant across an entire length thereof. Even this configuration, similar to the second embodiment, decreases the amount of expansion or contraction of each of the divided flexible portions 528, 529 during thermal compressing of the flexible board 523 to a liquid crystal panel 511. Thus, an effect is obtained that the flexible board 523 is connected to a proper position of the liquid crystal panel 511.

Seventh Embodiment

A seventh embodiment will be described with reference to FIG. 16. The seventh embodiment includes a flexible board 623 that is divided at different positions from the one in the second embodiment. Other configurations are similar to the second embodiment and thus configurations, functions, and effects similar to those will not be described.

Figure 16:
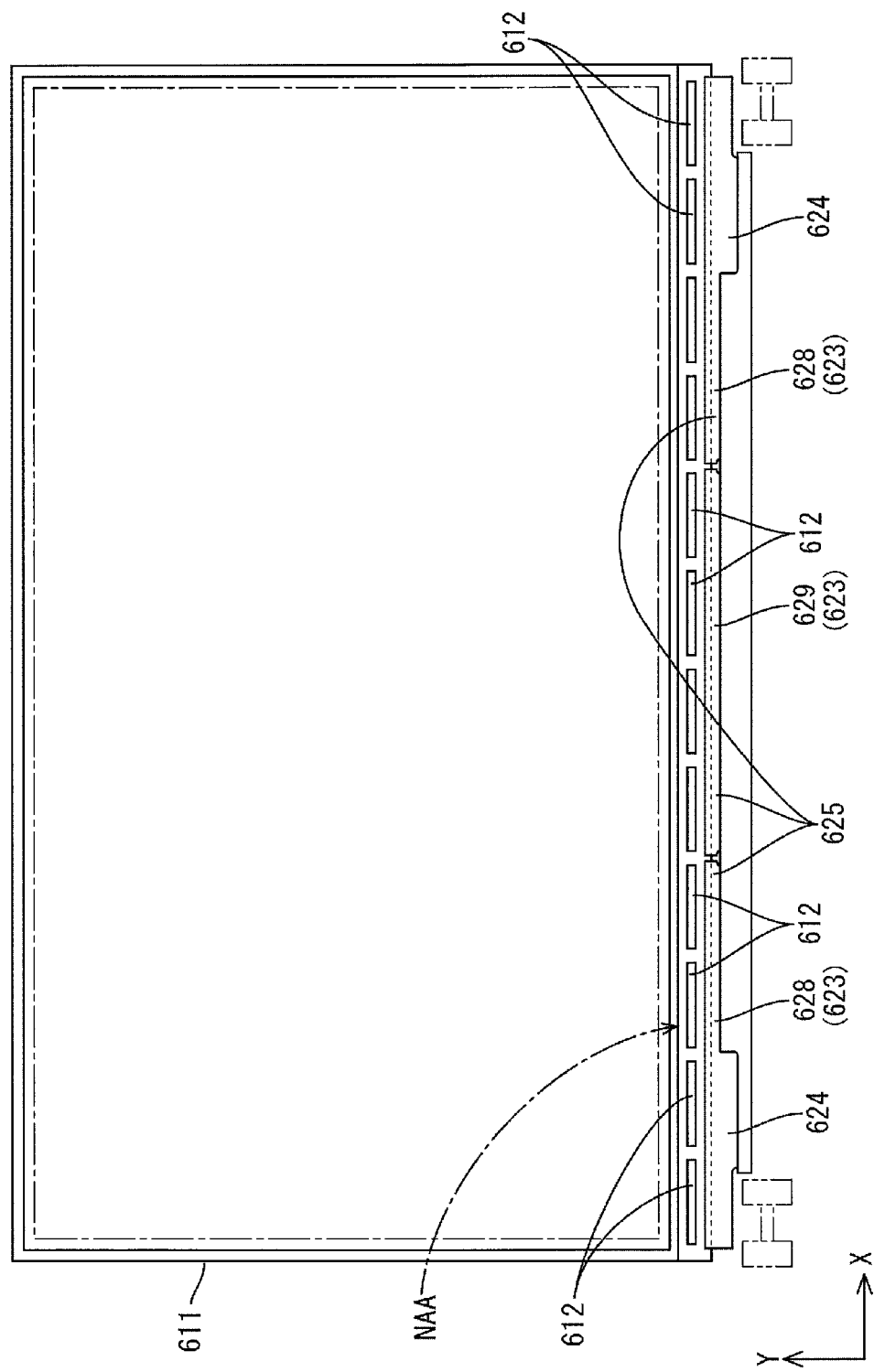
FIG. 16 is a plan view of a liquid crystal panel and a rigid-flex board according to a seventh embodiment.

As illustrated in FIG. 16, a flexible board 623 according to this embodiment includes a pair of divided flexible end portions 628 and a divided flexible middle portion 629. Each divided flexible end portions 628 corresponds to an entire area of a flexible end portion 624 and a part of a flexible middle portion 625. The divided flexible middle portion 629 corresponds to another part of the flexible middle portion 625. Specifically, the divided flexible end portion 628 includes the entire flexible end portion 624 and a portion of the flexible middle portion 625 adjacent to flexible end portion 624. A length of the divided flexible end portion 628 is substantially the same as that of the divided flexible middle portion 629. The flexible board 623 is evenly divided into three pieces at positions off from borders between the flexible end portions 624 and the flexible middle portion 625 in the X-axis direction. Each divided flexible end portion 628 is connected with four drivers 612 located at an end of the non-display area NAA of a liquid crystal panel 611. The divided flexible middle portion 629 is connected with other four drivers 612 located at a middle of the non-display area NAA of the liquid crystal panel 611. Even this configuration, similar to the second embodiment, reduces the amount of thermal expansion or contraction of each of the divided flexible portions 628, 629 during thermal compressing of the flexible board 623 to the liquid crystal panel 611. Thus, an effect is obtained that the flexible board 623 is connected to a proper position of the liquid crystal panel 611.

Eighth Embodiment

An eighth embodiment will be described with reference to FIG. 17. The eighth embodiment includes a rigid board 722 having a different shape from the one in the first embodiment. Other configurations are similar to the first embodiment and thus configurations, functions, and effects similar to those will not be described.

Figure 17:
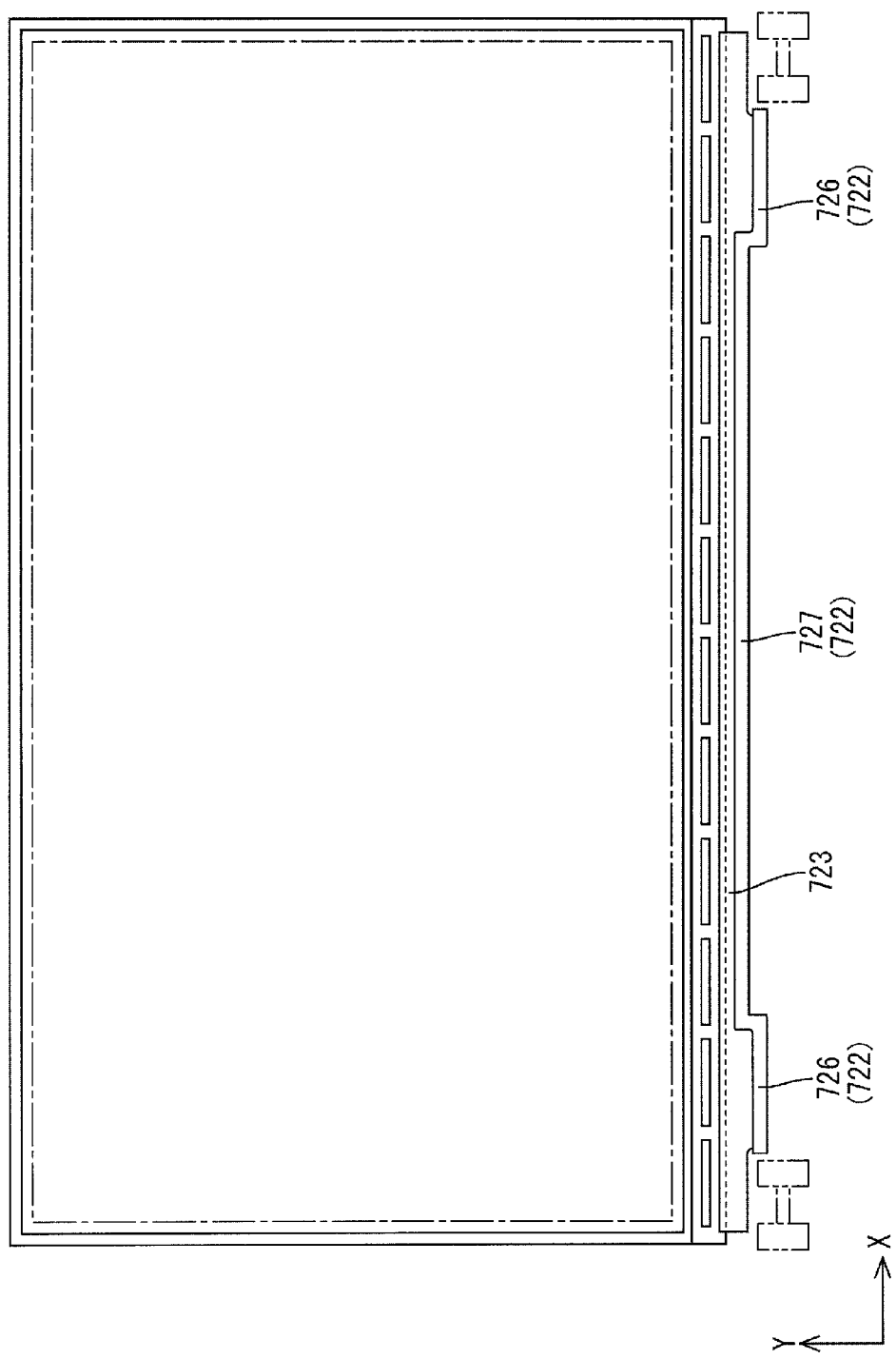
FIG. 17 is a plan view of a liquid crystal panel and a rigid-flex board according to an eighth embodiment.

As illustrated in FIG. 17, the rigid board 722 according to this embodiment extends in the X-axis direction with a crank shape at an intermediate portion thereof in a plan view. A dimension of the rigid board 722 in the Y-axis direction (a width dimension) is substantially constant over an entire length thereof. Specifically, the rigid board 722 includes rigid end portions 726 and a rigid middle portion 727 that form step-like edges at a side closer to a flexible board 723 and another side opposite from the side closer to the flexible board 723. The rigid end portions 726 are indented toward the rigid board 722 with respect to the rigid middle portion 727 (i.e., away from the flexible board 723). The rigid board 722 is bent at portions between the rigid end portions 726 and the rigid middle portion 727 so that has a crank-like shape. The rigid end portions 726 and the rigid middle portion 727 have substantially the same width.

Ninth Embodiment

A ninth embodiment will be described with reference to FIG. 18. A flexible board 823 according to the ninth embodiment includes flexible end portions 824 each having a different area size from the ones in the second embodiment. Other configurations are similar to the second embodiment and thus configurations, functions, and effects similar to those will not be described.

Figure 18:
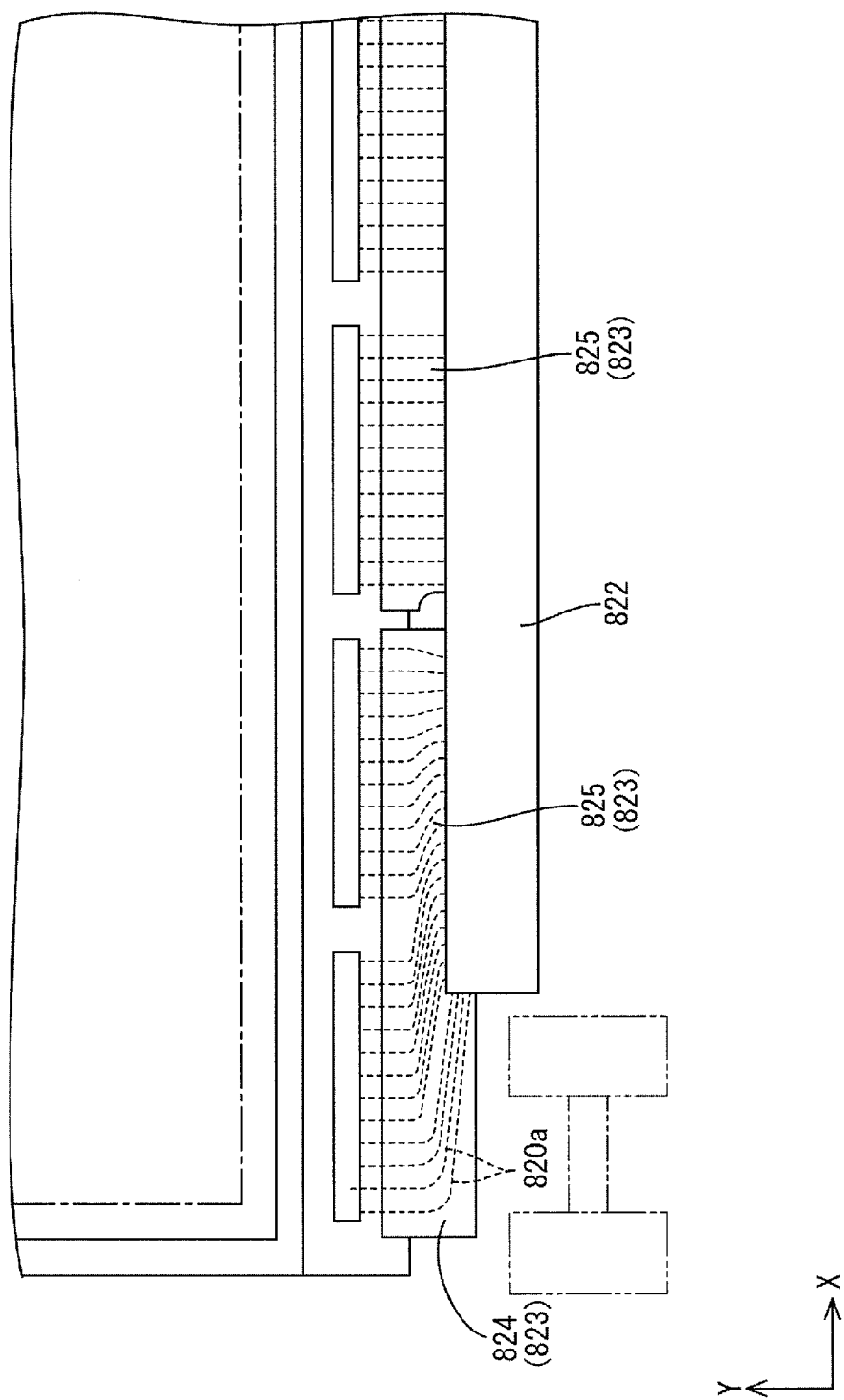
FIG. 18 is a magnified plan view of a liquid crystal panel and a rigid-flex board according to a ninth embodiment.

As illustrated in FIG. 18, the flexible end portion 824 only includes a portion of the flexible board 823 located on an outer side with respect to a rigid board 822 in the X-axis direction. The other portion of the flexible board 823 that overlaps the rigid board 822 over its entire dimension in the X-axis direction constitutes a flexible middle portion 825. The rigid board 822 is constant in dimension in the Y-axis direction (a width dimension) over its entire length in the X-axis direction. The rigid board 822 has a shape that is straight in the X-axis direction without any curves or bending. That is, the rigid board 822 has straight edges at a side closer to the flexible board 823 and another side away from the side closer to the flexible board 823. Flexible-side lines 820a formed in the flexible end portion 824 are connected to an end of the rigid board 822 in the Y-axis direction.

Tenth Embodiment

A tenth embodiment will be described with reference to FIGS. 19 and 20. Instead of the rigid-flex board as is included in the second embodiment, the tenth embodiment includes a flexible board 34 and a rigid board 35 as two independent components. Other configurations are similar to the second embodiment and thus configurations, functions, and effects similar to those will not be described.

Figure 19:
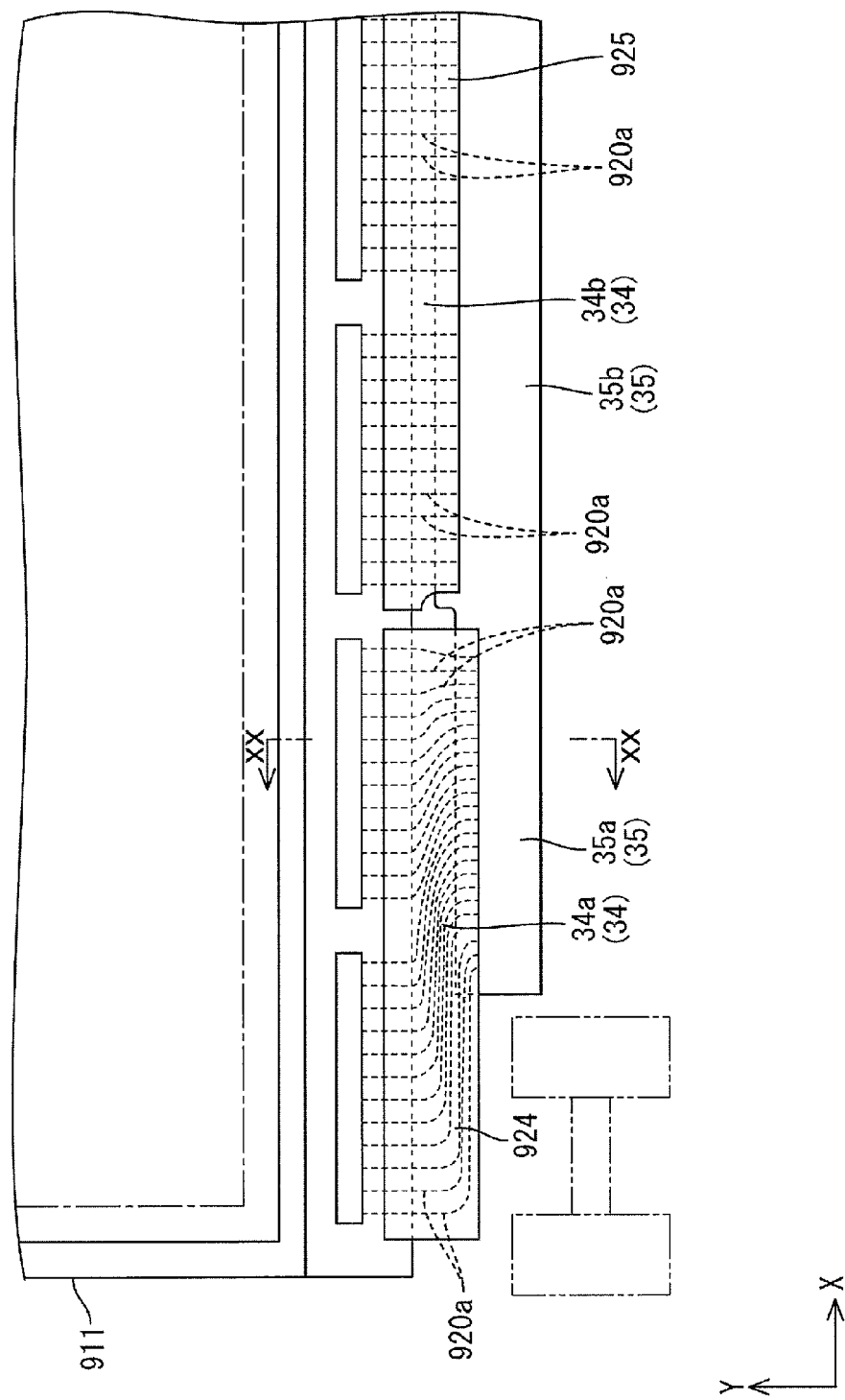
FIG. 19 is a magnified plan view of a liquid crystal panel, a flexible board, and a rigid board according to a tenth embodiment.
Figure 20:
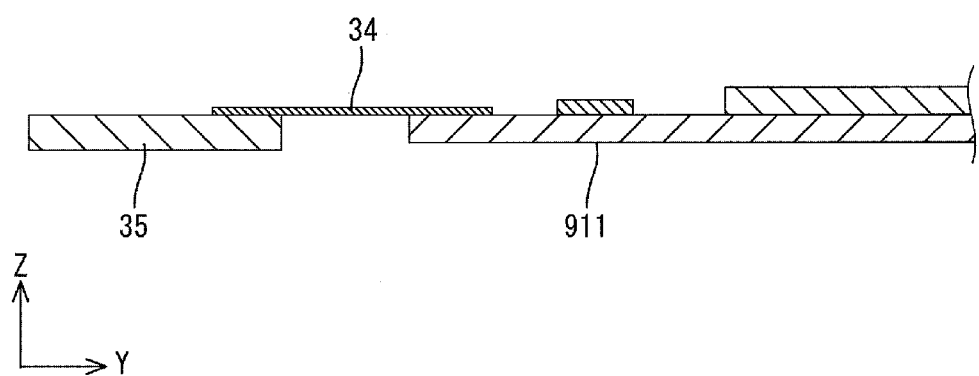
FIG. 20 is a cross-sectional view cut along line xx-xx in FIG. 19.

As illustrated in FIGS. 19 and 20, a liquid crystal panel 911 according to this embodiment is connected with one of edge portions of the flexible board 34 that has flexibility. Another one of the edge portions of the flexible board 34 is connected with the rigid board (a signal supplying board) 35 that has rigidity without having flexibility. Similar to the flexible board 123 included in the second embodiment, the flexible board 34 is divided into multiple pieces, that is, divided into divided flexible end portions 34a and a divided flexible middle portion 34b. Each divided flexible end portion 34a corresponds to a flexible end portion 924. The divided flexible middle portion 34b corresponds to a flexible middle portion 925. Each of the divided portions 34a, 34b includes flexible-side lines 920a, flexible-side terminals for panel, and flexible-side terminals for rigid board. Each flexible-side terminal for panel is formed at an end of the corresponding flexible-side line 920a and connected to a corresponding panel-side terminal for flexible board formed in a liquid crystal panel 911. Each flexible-side terminal for rigid board is formed at another end of the corresponding flexible-side line 920a and connected to a corresponding rigid-side terminal for flexible board formed in the rigid board 35. These terminals are electrically connected via anisotropic conductive films (ACF). The terminals and AFCs are not illustrated. The divided flexible end portion 34a includes an outer portion that is located on an outer side with respect to the rigid board 35 in the X-axis direction. A dimension of the divided flexible end portion 34a in the Y-axis direction is larger than a corresponding dimension of the divided flexible middle portion 34b. The rigid board 35 includes rigid end portions 35a and a rigid middle portion 35b. The rigid end portion 35a is connected to flexible end portion 34a and has a dimension in the Y-axis direction smaller than that of the rigid middle portion 35b that is connected to the divided flexible middle portion 34b.

Eleventh Embodiment

An eleventh embodiment will be described with reference to FIG. 21. The eleventh embodiment is a tablet-type laptop computer TNP including a liquid crystal display device. Other configurations are similar to the first embodiment and thus configurations, functions, and effects similar to those will not be described.

Figure 21:
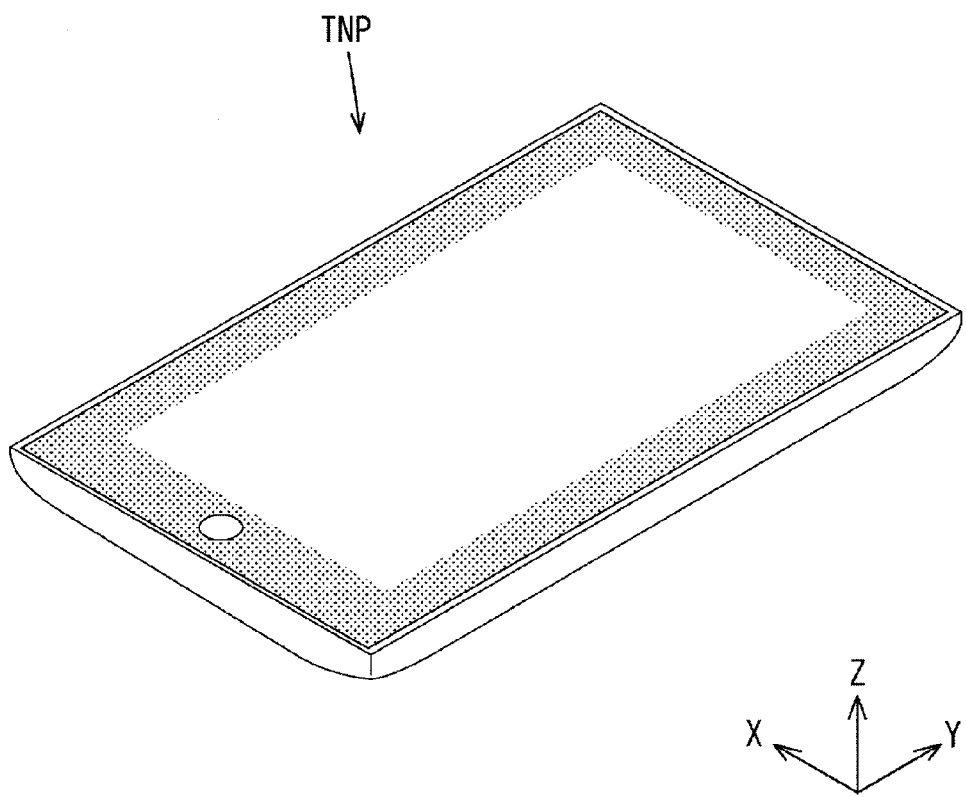
FIG. 21 is a perspective view illustrating a general configuration of a liquid crystal panel according to an eleventh embodiment.

As illustrated in FIG. 21, the tablet-type laptop computer TNP according to this embodiment includes a touch panel and a cover panel in addition to the liquid crystal display device. A user inputs data through the touch panel. The cover panel protects the touch panel. The tablet-type laptop computer TNP does not include hinges, that is, does not have a folding structure, unlike the laptop computer according to the first embodiment. Even in the tablet-type laptop computer TNP, a contact between a rigid-flex board of the liquid crystal display device and a speaker and a battery disposed in the tablet-type laptop computer TNP may cause a problem. However, by using the rigid-flex board included in the first embodiment, the rigid-flex board is less likely to be in contact with components such as the speaker and the battery.

Other Embodiments

The present invention is not limited to the embodiments described above and illustrated by the drawings. For examples, the following embodiments will be included in the technical scope of the present invention.

(1) In each of the above embodiments (except for the ninth embodiment), the first portion and the second end portion of the flexible end portion of the flexible board portion (the flexible board) have substantially the same length. However, the first end portion may be larger in length than the second end portion or the first end portion may be smaller in length than the second end portion.

(2) In each of the above embodiments (except for the ninth embodiment), the position of the border between the first end portion and the second end portion of the flexible end portion of the flexible board portion (the flexible board) substantially corresponds to the position of the border between the rigid end portion and the rigid middle portion of the rigid board portion (the rigid board). However, the border between the first end portion and the second end portion may be positioned off to the end in the X-axis direction or off to the middle in the X-axis direction with respect to the border between the rigid end portion and the rigid middle portion.

(3) In each of the above embodiments (except for the ninth embodiment), the position of the border between the first end portion and the second end portion of the flexible end portion of the flexible board portion (the flexible board) substantially corresponds to the position of a border area between the drivers adjacent to each other on the liquid crystal panel. However, the border and the border area may be off from each other in the X-axis direction.

(4) In each of the first to ninth embodiments, the rigid-flex board includes two rigid members. However, three or more rigid members may be stacked on one another.

(5) In each of the above embodiments, twelve drivers are arranged on the liquid crystal panel. However, the number of the drivers may be appropriately altered (e.g. equal to or less than eleven or equal to or more than thirteen).

(6) In each of the second to seventh, ninth, and tenth embodiments, two drivers are connected to one divided flexible portion (the divided flexible board). However, the drivers and the respective divided flexible portions may be connected one to one by applying the above embodiment (5) with an equal number of the drivers and the divided flexible portions. Alternatively, the number of the drivers may be an integral multiple of 3 and every three or more drivers may be connected to one divided flexible portion.

(7) In each of the second to seventh, ninth, and tenth embodiments, two drivers are connected to one divided flexible portion (the divided flexible board). However, multiple drivers may be connected to one divided flexible portion while single driver may be connected to single divided flexible portion.

(8) In each of the second to seventh, ninth, and tenth embodiments, the position at which the flexible board (the flexible board) is divided and the number of pieces into which the flexible board is divided may be altered as appropriate.

(9) As a modification of the second to seventh and ninth embodiments, the portion of the flexible member constituting the rigid board may have the non-divided structure while the portion of the flexible member constituting the flexible board may have the divided structure.

(10) As a modification of the first and eighth embodiments, the portion of the flexible member constituting the flexible board may have the non-divided structure while the portion of the flexible member constituting the rigid board may have the divided structure.

(11) In the above embodiments, the width of the rigid end portion is smaller than that of the rigid middle portion or the width is constant over the entire length of the rigid board (the rigid board). However, the width of the rigid end portion may be larger than that of the rigid middle portion.

(12) The third to seventh, ninth, and tenth embodiments are modifications of the second embodiment. However, the techniques included in the third to fifth, ninth, and tenth embodiments may be applied to the first embodiment. The eleventh embodiment may be combined with the second to tenth embodiments. Other than the above combinations, embodiments may be freely combined with one another.

(13) As a modification of the fourth embodiment, the oblique portion of the first end portion of the divided flexible end portion (the flexible end portion) may have an arch-like shape that curves inward (forms a concavity) with respect to the line (cord) which connects ends of the oblique portion, or in other words, that is curved toward the liquid crystal panel.

(14) In the above embodiments, the difference in length of the flexible board (the flexible board) and the rigid board (the rigid board) is substantially equal to or smaller than the length of the spaces for the pair of the hinges. However, the difference in length of the flexible board and the rigid board may be larger than the length of the spaces for the pair of the hinges.

(15) In the first to tenth embodiments, the laptop computer including the liquid crystal display device is used as an example. However, other than the laptop computers, the scope of the present invention is applicable for folding-type electronic devices that include hinges, such as folding-type mobile phones and folding-type video game players.

(16) In the embodiment 11, the tablet-type laptop computer is used as an example. However, the scope of the present invention is applicable for electronic devices without hinges. For example, the scope of the present invention is applicable for smart phones, television devices, and digital signage.

(17) In the above embodiments, the display size of the liquid crystal panel is from several inches to a dozen inches. However, liquid crystal panels that are classified as middle sized or large sized (or supersized) displays having screen sizes from 20 inches to 90 inches are included in the scope of the present invention.

(18) In the above embodiments, the liquid crystal panel includes the color portions of the color filter in three colors of R, G and B. However, the liquid crystal panel may include four or more colors of color portions.

(19) In the above embodiments, the liquid crystal panel has a horizontally long rectangular shape. However, vertically long rectangular liquid crystal panels and square liquid crystal panels are included in the scope of the present invention.

(20) The transmissive liquid crystal display device including the backlight unit, which is an external light source, is provided as an example. However, a reflective liquid crystal display device using ambient light for display is included in the scope of the present invention. In this case, the backlight unit is not required.

(21) In the above embodiments, the TFTs are used for switching components of the liquid crystal display device. However, a liquid crystal display device including switching components other than the TFTs (e.g., thin film diodes (TFDs)) is included in the scope of the present invention. A color liquid crystal display and a black-and-white liquid crystal display are also included in the scope of the present invention.

(22) The liquid crystal display device including the liquid crystal panel as a display panel is provided as an example. However, a display device including other kind of display panel (e.g., a plasma display panel) and a display device including organic EL panel are included in the scope of the present invention. In such display devices, the backlight unit is not required.

(23) In the liquid crystal panel in each of the above embodiments, the display area is arranged medially with respect to the long-side direction but closer to one of the ends with respect to the short-side direction. However, the liquid crystal panel may be arranged medially with respect to the short-side direction but closer to one of the ends with respect to the long-side direction. The display area of the liquid crystal panel may be arranged closes to one of the ends with respect to the long-side direction and to one of the ends with respect to the short-side direction. The display area of the liquid crystal panel may be arranged medially with respect to the long-side direction and at the middle with respect to the short-side direction.

(24) In each of the above embodiments, the length of the rigid-flex board is substantially smaller of the long-side dimension of the liquid crystal panel. However, the specific length of the rigid-flex board may be altered as appropriate. The length of the rigid-flex board may be about a half of that of the liquid crystal panel.

EXPLANATION OF SYMBOLS

10: liquid crystal display device (display device), 11, 111, 211, 311, 411, 511, 611, 911: liquid crystal panel (display panel), 11a: CF substrate (substrate), 11b: array substrate (substrate), 11c: liquid crystal layer (liquid crystals), 12, 112, 612: driver (driving circuit), 13, 113: rigid-flex board, 18, 118: panel-side input line (signal transmission line), 20, 120: flexible member, 20a, 820a, 920a: flexible-side line (tracing pattern), 21: rigid member, 22, 122, 222, 322, 422, 722, 822: rigid board (signal supplying board), 23, 123, 223, 523, 623, 723, 823: flexible board (flexible board), 24, 124, 224, 524, 624, 824, 924: flexible end portion (end portion), 24a, 224a, 324a, 424a: first end portion (outer portion located on an outer side with respect to the signal supplying board in the second direction), 24b: second end portion (adjacent portion), 25, 125, 525, 625, 825, 925: flexible middle portion (middle portion), 26, 726: rigid end portion (end portion), 27, 127, 727: rigid middle portion (end portion), 28, 228, 328, 428, 528, 628: divided flexible end portion (divided flexible end board), 29, 529, 629: divided flexible middle portion (divided flexible middle board), 30: divided flexible middle piece (divided flexible middle piece), 31: end-driver (end-side driving circuit), 32: middle-driver (middle driving circuit), 33, 333, 433: oblique portion, 34: flexible board, 34a: divided flexible end board, 34b: divided flexible middle board, 35: rigid board (signal supplying board), 35a: rigid end portion (end portion), 35b: rigid middle portion (middle portion), AA: display area, NAA: non-display area.

The invention claimed is:

1. A display device, comprising:
a display panel including a display area for displaying an image and a non-display area other than the display area;
a signal supplying board to be connected to an external signal source; and
a flexible board having flexibility and including one edge portion connected to the non-display area of the display panel and another edge portion connected to the signal supplying board to relay supply of signals from the signal supplying board, wherein
the display panel and the flexible board are arranged in a first direction, and a direction perpendicular to the first direction and along a plate surface of the display panel is a second direction,
the flexible board has a dimension in the second direction larger than a dimension of the signal supplying board in the second direction, the flexible board including an end portion and a middle portion, the end portion including at least an outer portion of the flexible board located on an outer side with respect to the signal supplying board in the second direction, the middle portion being located about a middle of the flexible board with respect to the end portion in the second direction,
the end portion of the flexible board has a dimension in the first direction larger than a dimension of the middle portion in the first direction,
the end portion of the flexible board includes an adjacent portion adjacent to the outer portion that is located on an outer side with respect to the signal supplying board in the second direction, and
the flexible board is connected with the rigid board at the adjacent portion of the end portion adjacent to the outer portion of the end portion located on the outer side with respect to the signal supplying board in the second direction, and the outer portion located on the outer side with respect to the signal supplying board in the second direction has a dimension in the first direction that is constant or increases from an end of the flexible board toward a middle of the flexible board in the second direction.

2. The display device according to claim 1, wherein the end portion of the flexible board and the middle portion of the flexible board are connected to the display device at a same position of the display panel with respect to the first direction.

3. The display device according to claim 1, wherein the outer portion that is located on the outer side with respect to the signal supplying board in the second direction and constitutes at least a portion of the end portion of the flexible board includes an oblique portion at the other edge portion of the flexible board.

4. The display device according to claim 1, wherein
the signal supplying board and the flexible board are an integrated member as a rigid-flex board,
the rigid-flex board includes a flexible member having flexibility and a pair of rigid members having rigidity, the pair of the rigid members and a portion of the flexible member sandwiched by the pair of the rigid members constitutes a rigid board portion, another portion of the flexible member constitutes a flexible board portion, and
the flexible board portion has a dimension in the second direction larger than a dimension of the rigid board portion in the second direction, the flexible board portion including an end portion and a middle portion, the end portion of the flexible board portion including at least an outer portion that is located on an outer side with respect to the rigid board portion in the second direction, the middle portion of the flexible board portion being located about a middle of the flexible board portion in the second direction, the end portion of the flexible board portion having a dimension in the first direction larger than a dimension of the middle portion of the flexible board portion in the first direction.

5. The display device according to claim 1, further comprising a signal transmission line in a portion of the non-display area of the display panel between the display area and the flexible board, the signal transmission line being configured to transmit a signal sent through the signal supplying board and the flexible board to the display area.

6. The display device according to claim 1, wherein the display panel includes a pair of substrates and liquid crystals sealed between the pair of the substrates.

7. A display device, comprising:
a display panel including a display area for displaying an image and a non-display area other than the display area;
a signal supplying board to be connected to an external signal source; and
a flexible board having flexibility and including one edge portion connected to the non-display area of the display panel and another edge portion connected to the signal supplying board to relay supply of signals from the signal supplying board, wherein
the display panel and the flexible board are arranged in a first direction, and a direction perpendicular to the first direction and along a plate surface of the display panel is a second direction,
the flexible board has a dimension in the second direction larger than a dimension of the signal supplying board in the second direction, the flexible board including an end portion and a middle portion, the end portion including at least an outer portion of the flexible board located on an outer side with respect to the signal supplying board in the second direction, the middle portion being located about a middle of the flexible board with respect to the end portion in the second direction, the end portion of the flexible board has a dimension in the first direction larger than a dimension of the middle portion in the first direction, and the signal supplying board includes an end portion and a middle portion, the end portion of the signal supplying board is connected to the end portion of the flexible board, the middle portion of the signal supplying board is connected to the middle portion of the flexible board, and the end portion of the signal supplying board has a dimension in the first direction smaller than a dimension of the middle portion of the signal supplying board in the first direction.

8. The display device according to claim 7, wherein the end portion of the signal supply board and the middle portion of the signal supply board each include an edge away from the flexible board, the edges of the end portion and the middle portion of the signal supply board are flush with each other.

9. The display device according to claim 4, wherein the end portion of the flexible board and the middle portion of the flexible board are connected to the display device at a same position of the display panel with respect to the first direction.

10. The display device according to claim 4, wherein the outer portion that is located on the outer side with respect to the signal supplying board in the second direction and constitutes at least a portion of the end portion of the flexible board includes an oblique portion at the other edge portion of the flexible board.

11. The display device according to claim 4, wherein the signal supplying board and the flexible board are an integrated member as a rigid-flex board, the rigid-flex board includes a flexible member having flexibility and a pair of rigid members having rigidity, the pair of the rigid members and a portion of the flexible member sandwiched by the pair of the rigid members constitutes a rigid board portion, another portion of the flexible member constitutes a flexible board portion, and the flexible board portion has a dimension in the second direction larger than a dimension of the rigid board portion in the second direction, the flexible board portion including an end portion and a middle portion, the end portion of the flexible board portion including at least an outer portion that is located on an outer side with respect to the rigid board portion in the second direction, the middle portion of the flexible board portion being located about a middle of the flexible board portion in the second direction, the end portion of the flexible board portion having a dimension in the first direction larger than a dimension of the middle portion of the flexible board portion in the first direction.

12. The display device according to claim 7, further comprising a signal transmission line in a portion of the non-display area of the display panel between the display area and the flexible board, the signal transmission line being configured to transmit a signal sent through the signal supplying board and the flexible board to the display area.

13. A display device, comprising:

a display panel including a display area for displaying an image and a non-display area other than the display area;

a signal supplying board to be connected to an external signal source; and a flexible board having flexibility and including one edge portion connected to the non-display area of the display panel and another edge portion connected to the signal supplying board to relay supply of signals from the signal supplying board, wherein the display panel and the flexible board are arranged in a first direction, and a direction perpendicular to the first direction and along a plate surface of the display panel is a second direction, the flexible board has a dimension in the second direction larger than a dimension of the signal supplying board in the second direction, the flexible board including an end portion and a middle portion, the end portion including at least an outer portion of the flexible board located on an outer side with respect to the signal supplying board in the second direction, the middle portion being located about a middle of the flexible board with respect to the end portion in the second direction, the end portion of the flexible board has a dimension in the first direction larger than a dimension of the middle portion in the first direction, and the end portion of the flexible board and the middle portion of the flexible board are at least separate from each other, and the flexible board includes a divided flexible end board corresponding to the end portion of the flexible board and includes a divided flexible middle board corresponding to the middle portion of the flexible board.

14. The display device according to claim 13, wherein the divided flexible middle board includes a plurality of separate pieces as a plurality of divided flexible middle pieces.

15. The display device according to claim 13, wherein the signal supplying board includes an end portion connected to the end portion of the flexible board, and a middle portion connected to the middle portion of the flexible board, the end portion of the signal supplying board has a dimension in the first direction smaller than a dimension of the middle portion of the signal supplying board in the first direction, and the divided flexible end portion of the flexible board is connected to the end portion of the signal supplying board, and the divided flexible middle portion of the flexible board is connected to the middle portion of the signal supplying board.

16. The display device according to claim 13, further comprising a plurality of driving circuits mounted on a portion of the non-display area of the display panel between the display area and the flexible board, the driving circuits being configured to process a signal transmitted through the signal supplying board and the flexible board, generate an output signal, and send the output signal to the display area for driving the display panel, wherein the driving circuits are arranged in the non-display area in the second direction and includes at least an end driving circuit connected to the divided flexible end board of the flexible board and a middle driving circuit connected to the divided flexible middle board of the flexible board.

17. The display device according to claim 13, wherein the end portion of the flexible board and the middle portion of the flexible board are connected to the display device at a same position of the display panel with respect to the first direction.

18. The display device according to claim 13, wherein the outer portion that is located on the outer side with respect to the signal supplying board in the second direction and constitutes at least a portion of the end portion of the flexible board includes an oblique portion at the other edge portion of the flexible board.

19. The display device according to claim 13, wherein
the signal supplying board and the flexible board are an integrated member as a rigid-flex board,
the rigid-flex board includes a flexible member having flexibility and a pair of rigid members having rigidity, the pair of the rigid members and a portion of the flexible member sandwiched by the pair of the rigid members constitutes a rigid board portion, another portion of the flexible member constitutes a flexible board portion, and
the flexible board portion has a dimension in the second direction larger than a dimension of the rigid board portion in the second direction, the flexible board portion including an end portion and a middle portion, the end portion of the flexible board portion including at least an outer portion that is located on an outer side with respect to the rigid board portion in the second direction, the middle portion of the flexible board portion being located about a middle of the flexible board portion in the second direction, the end portion of the flexible board portion having a dimension in the first direction larger than a dimension of the middle portion of the flexible board portion in the first direction.

20. The display device according to claim 13, further comprising a signal transmission line in a portion of the non-display area of the display panel between the display area and the flexible board, the signal transmission line being configured to transmit a signal sent through the signal supplying board and the flexible board to the display area.

* * * * *